(12) United States Patent
Yamazaki et al.

(10) Patent No.: US 6,492,659 B1
(45) Date of Patent: Dec. 10, 2002

(54) SEMICONDUCTOR DEVICE HAVING SINGLE CRYSTAL GRAINS WITH HYDROGEN AND TAPERED GATE INSULATION LAYER

(75) Inventors: Shunpei Yamazaki, Tokyo (JP); Yasuyuki Arai, Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 09/570,612

(22) Filed: May 12, 2000

(30) Foreign Application Priority Data

May 31, 1999 (JP) .......................................... 11-152902
May 15, 1999 (JP) .......................................... 11-171485

(51) Int. Cl.[7] .............................................. H01L 29/00
(52) U.S. Cl. ............................ 257/59; 257/55; 257/56; 257/66; 257/349
(58) Field of Search ...................... 257/55–67, 349–355

(56) References Cited

U.S. PATENT DOCUMENTS

| | | | | |
|---|---|---|---|---|
| 5,304,829 A | * | 4/1994 | Mori et al. .................. | 257/354 |
| 5,426,315 A | * | 6/1995 | Pfiester ........................ | 257/66 |
| 5,643,826 A | | 7/1997 | Ohtani et al. | |
| 5,893,730 A | | 4/1999 | Yamazaki et al. | |
| 5,923,962 A | | 7/1999 | Ohtani et al. | |
| 6,281,260 B1 | * | 4/2001 | Lee et al. .................... | 438/665 |
| 6,277,679 B1 | * | 8/2001 | Ohtani ........................ | 438/151 |

FOREIGN PATENT DOCUMENTS

| | | |
|---|---|---|
| JP | 7-130652 | 5/1995 |
| JP | 10-247735 | 9/1998 |

OTHER PUBLICATIONS

IBM Tech. Disclosure Balletine, vol. 11, No. 7, Dec. 1968 Baket et al.*
Shimizu et al., "High–Mobility Poly–Si Thin–Film Transistors Fabricated by a Novel Excimer Laser Crystallization Method", Jan. 1993, pp. 112–117, IEEE Transactions on Electron Devices, vol. 40. No. 1.
Ishihara et al., "Location–Controlled Adjacent Grains Following Excimer–Laser Melting of Si Thin–Films", 1998, pp. 153–156, AM–LCD.
Specifications and Drawings for Application Ser. No. 09/696,165, "Semiconductor Device and Method of Manufacturing the Same", Filed on Oct. 26, 2000, pp. 1–63, 33 pages of drawings, Inventors: Ritsuko Kawasaki et al.

(List continued on next page.)

*Primary Examiner*—Fetsum Abraham
(74) *Attorney, Agent, or Firm*—Eric J. Robinson; Robinson Intellectual Property Law Office, P.C.

(57) ABSTRACT

To fabricate a crystalline semiconductor film with controlled locations and sizes of the crystal grains, and to utilize the crystalline semiconductor film in the channel-forming region of a TFT in order to realize a high-speed operable TFT. A translucent insulating thermal conductive layer 2 is provided in close contact with the main surface of a substrate 1, and an insular or striped first insulating layer 3 is formed in selected regions on the thermal conductive layer. A second insulating layer 4 and semiconductor film 5 are laminated thereover. The semiconductor film 5 is first formed with an amorphous semiconductor film, and then crystallized by laser annealing. The first insulating layer 3 has the function of controlling the rate of heat flow to the thermal conductive layer 2, and the temperature distribution difference on the substrate 1 is utilized to form a single-crystal semiconductor film on the first insulating layer 3.

45 Claims, 28 Drawing Sheets

OTHER PUBLICATIONS

Specifications and Drawings for Application Ser. No. 09/732,724, "Semiconductor Device and a Method of Manufacturing the Same", Filed on Dec. 11, 2000, pp. 1–50, 26 pages of drawings, Inventors: Ritsuko Kawasaki et al.

Specifications and Drawings for Application Ser. No. 09/640, 077, "Semiconductor Device and Method of Fabricating the Same", Filed on Aug. 17, 2000, pp. 1–59, 23 pages of Drawings, Inventors: Ritsuko Kawasaki et al.

Specifications and Drawings for Application Ser. No. 09/598,827, "Method of Fabricating a Semiconductor Device", Filed on Jun. 21, 2000, pp. 1–64, 25 pages of drawings, Inventors: Kenji Kasahara.

Ishihara et al., "Location Control of Large Grain Following Excimer–Laser Melting of Si Thin–Films", Jpn. J. Appl. Phys. vol. 37, Part 1, No. 3B, Mar. 1998, pp. 1071–1075.

* cited by examiner

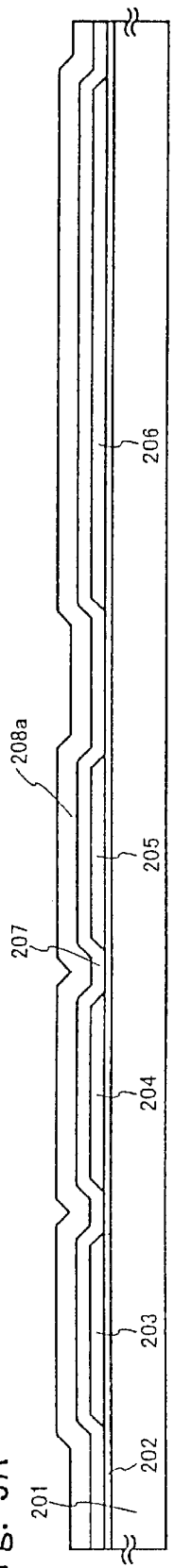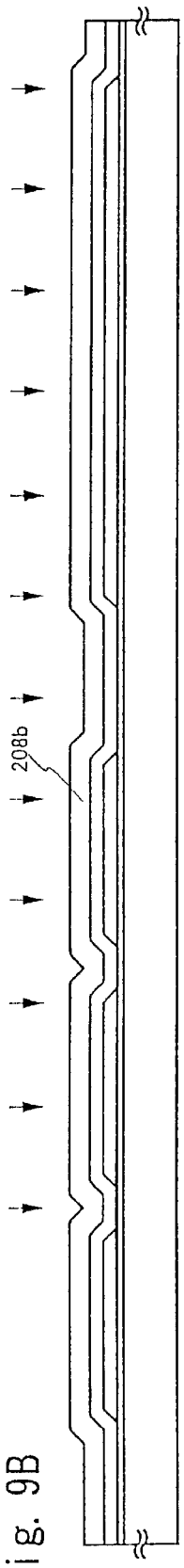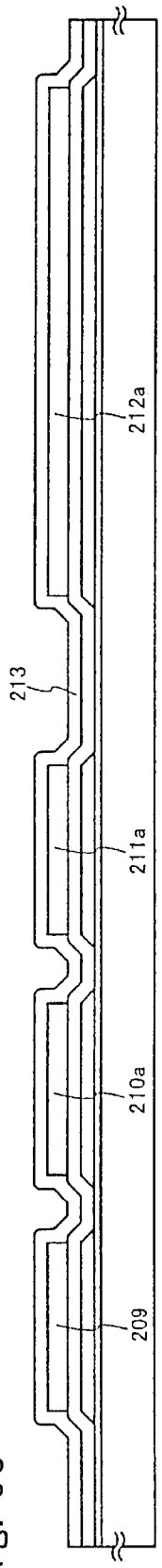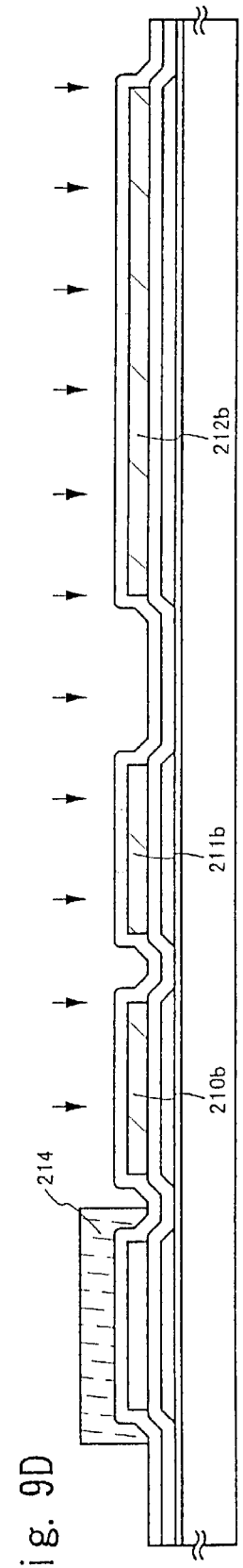

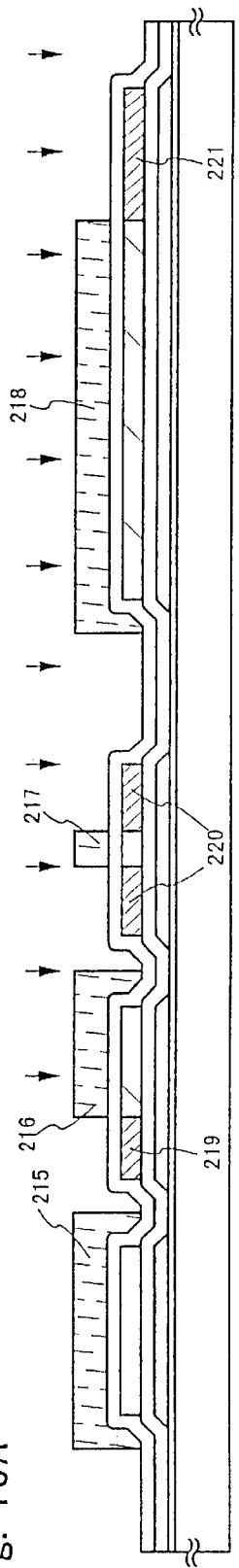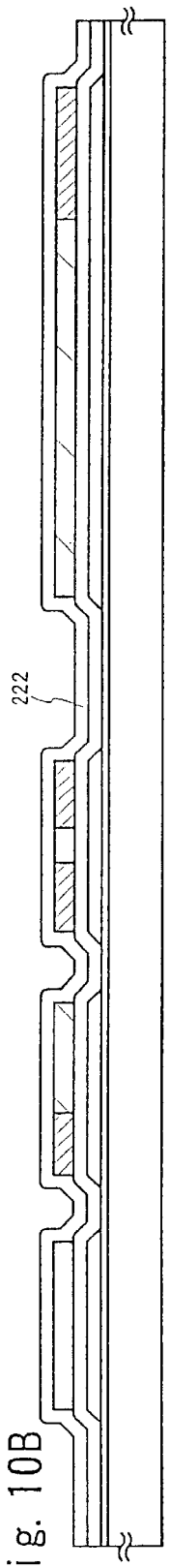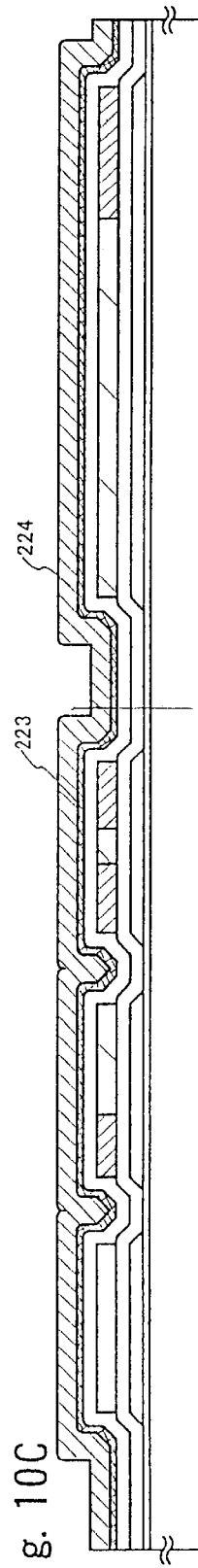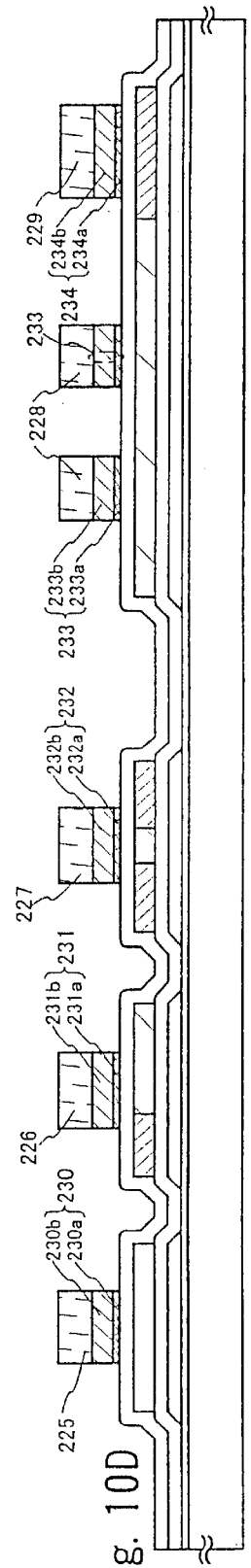

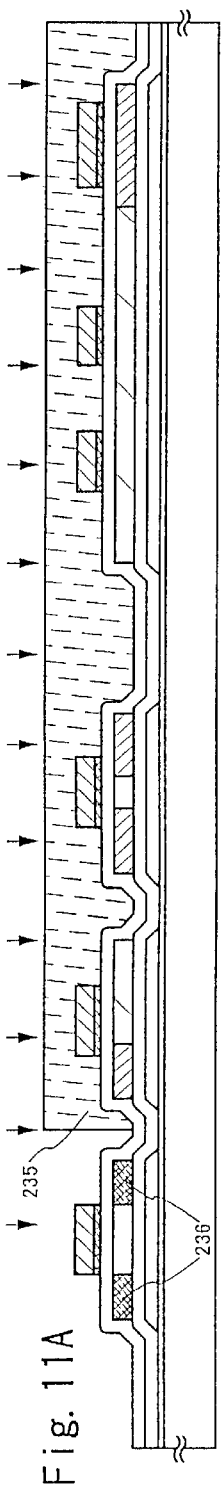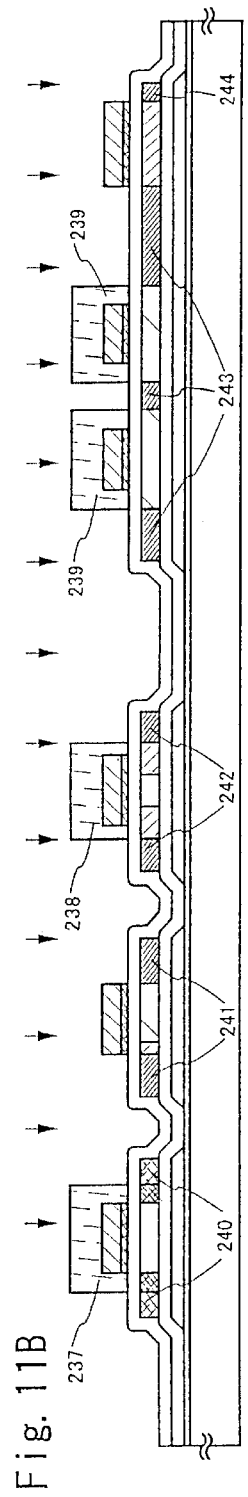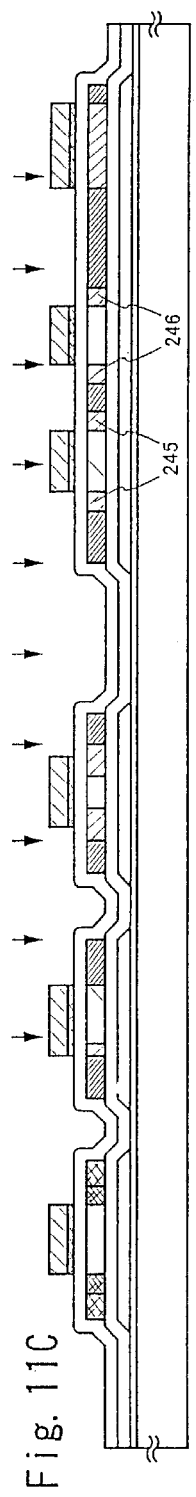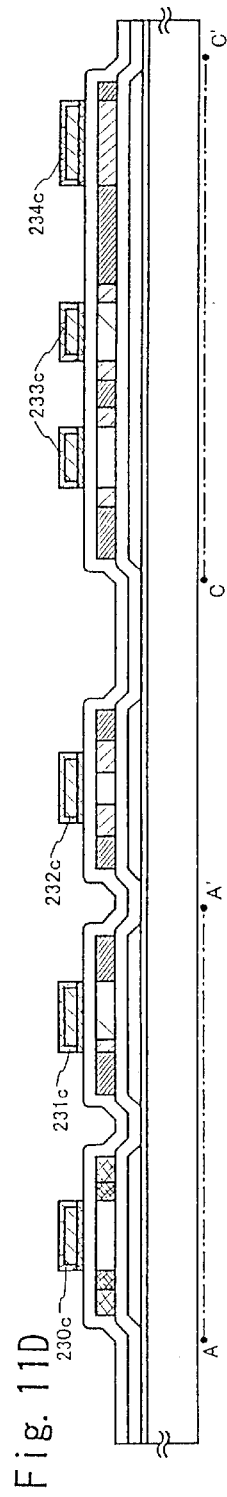

SEMICONDUCTOR DEVICE HAVING SINGLE CRYSTAL GRAINS WITH HYDROGEN AND TAPERED GATE INSULATION LAYER

FIELD OF THE INVENTION

The present invention relates to a semiconductor film having a crystalline structure formed on a substrate with an insulating surface and to a method for its fabrication, as well as to semiconductor devices employing the semiconductor film as an active layer and to a method for their fabrication. The invention particularly relates to a thin film transistor having an active layer formed with a crystalline semiconductor film. Throughout the present specification, "semiconductor device" will refer generally to a device that functions by utilizing semiconductor properties, and this includes electrooptical devices typically including active-matrix type liquid crystal display devices formed using thin film transistors, as well as electronic devices having such electrooptical devices as mounted members thereof.

BACKGROUND OF THE INVENTION

Thin film transistors (hereunder abbreviated to TFTs) have been developed that possess crystalline semiconductor films as active layers, obtained by forming amorphous semiconductor films on translucent insulating substrates such as glass and crystallizing them by laser annealing, heat annealing or the like. The principal substrates used for fabrication of such TFTs are glass substrates consisting of barium borosilicate glass or aluminoborosilicate glass. Such glass substrates have poorer heat resistance than quartz substrates but have a lower market price, and therefore offer the advantage of allowing easier manufacture of large-sized substrates.

Laser annealing is known as a crystallizing technique that can accomplish crystallization by applying high energy only onto the amorphous semiconductor film, without significantly increasing the temperature of the glass substrate. In particular, excimer lasers obtained by shortwave light output are thought to be most suited for this use. Laser annealing using excimer lasers is carried out by using an optical system to process a laser beam into a spot or line onto an irradiating surface, and scanning the irradiating surface with the processed laser light (moving the laser light irradiation position relative to the irradiating surface). For example, excimer laser annealing employing linear laser light can accomplish laser annealing of an entire irradiating surface by scanning simply in the lengthwise direction and the direction perpendicular thereto, and because of its excellent productivity it has become the main manufacturing technique for liquid crystal display devices employing TFTs.

Laser annealing can be applied for crystallization of many types of semiconductor materials. From the standpoint of TFT properties, however, the use of a crystalline silicon film as the active layer is thought to be suitable since this allows a high degree of mobility to be realized. This technique was used to achieve a monolithic liquid crystal display device having a pixel TFT forming an image section on one glass substrate and a driving circuit TFT provided around the image section.

However, crystalline silicon films fabricated by laser annealing are aggregates of multiple crystal grains whose locations and sizes are random, and therefore it has not been possible to deliberately form crystal grains at desired locations. Consequently, it has been virtually impossible to use single crystal grains to form TFT channel-forming regions, for which crystallinity is most crucial. At the interface between the crystal grains (grain boundaries), the, influence of the potential level at the recrystallization centers, trapping centers or crystal grain boundaries, which is a cause of amorphous structure or crystal defects, has resulted in reduced carrier current conveying characteristics. Because of this, the TFTs using crystalline silicon films as active layers obtained to date have not exhibited properties equivalent to those of MOS transistors fabricated on single crystal silicon substrates.

As a method of solving this problem, it has been considered an effective means to increase the crystal grain size while controlling the locations of the crystal grains to eliminate the crystal grain boundaries from the channel-forming region. For example, in "Location Control of Large Grain Following Excimer-Laser Melting of Si Thin-Films", R. Ishihara and A. Burtsev, Japanese Journal of Applied Physics vol.37, No.3B, pp.1071–1075, 1998" there is disclosed a method for three-dimensional control of silicon film temperature distribution to achieve location control and large grain sizes of crystals. According to this method, excimer laser light is irradiated onto both sides of a wafer comprising a high-melting-point metal formed as a film on a glass substrate, a silicon oxide film with a different film thickness partially formed thereover and an amorphous silicon film formed on the surface thereof, whereby it is reported that the crystal grain size can be increased to a few $\mu$m.

The aforementioned method of Ishihara et al. is characterized by locally altering the heat characteristics of the underlying material of the amorphous silicon film, in order to control the flow of heat to the substrate to introduce a temperature gradient. However, this requires formation of a three-layer structure of a high-melting-point metal layer/silicon oxide layer/semiconductor film on the glass substrate. While it is structurally possible to form a top gate-type TFT with the semiconductor film as the active layer, the parasitic capacitor generated between the semiconductor film and the high-melting-point metal layer increases the power consumption, thus creating a problem against realization of a high-speed operation TFT.

On the other hand, if the high-melting-point metal layer also serves as a gate electrode, it can be effectively applied to a bottom gate-type or inversed stagger-type TFT. However, in the aforementioned three-layer structure, even if the thickness of the semiconductor film is eliminated, the film thickness of the high-melting-point metal layer and the silicon oxide layer will not necessarily match the film thickness suited for the crystallization step and the film thickness suited for the characteristics as a TFT element, such that it is impossible to simultaneously satisfy the optimum design for the crystallization step and the optimum design for the element structure.

Furthermore, when a non-translucent high-melting-point metal layer is formed over the entire surface of a glass substrate it is not possible to fabricate a transmitting liquid crystal display device. The high-melting-point metal layer is useful in terms of its high thermal conductivity, but the chrome (Cr) film or titanium (Ti) film that is typically used as the high-melting-point metal material exhibits a high internal stress, and therefore often produces problems of cohesion with the glass substrate. The effect of the internal stress reaches to the semiconductor film formed on the top layer, and presents a concern of acting as a force causing distortion in the formed crystalline semiconductor film.

The present invention is a technique designed to overcome such problems, whereby a crystalline semiconductor film with controlled crystal grain locations and sizes is fabricated, and the crystalline semiconductor film is used in a TFT channel-forming region to realize a TFT allowing high-speed operation. It is also an object of the invention to provide a technique whereby such a TFT can be applied to various semiconductor devices such as transmitting liquid crystal display devices and image sensors.

SUMMARY OF THE INVENTION

A means for solving the problems described above will now be explained with reference to FIG. 1. A translucent, insulating thermal conductive layer 2 is provided in close contact with the main surface of a substrate 1, and an insular or stripe-shaped first insulating layer 3 is formed in a selected region of the thermal conductive layer. A second insulating layer 4 and semiconductor film 5 are laminated thereover. First, the semiconductor film 5 is formed using a semiconductor film with an amorphous structure (amorphous semiconductor film). The first insulating layer 3 and second insulating layer 4 provide a function for control of the flow rate of heat to the thermal conductive layer 2. The second insulating layer 4 may also be absent. In any case, the amorphous semiconductor film 5 is continuously formed in the region of the substrate in which the first insulating layer 3 is formed as well as the other regions.

The semiconductor film 5 formed with the amorphous structure is crystallized into a crystalline semiconductor film. The crystallization step is most preferably carried out by laser annealing. An excimer laser light source with a laser light output at a wavelength of 400 nm or lower is particularly preferred since it allows preferential heating of the semiconductor film. The excimer laser used may be a pulse oscillation type or continuous emission type. The light irradiated onto the semiconductor film 5 may be a linear beam, spot beam, sheet beam or the like depending on the optical system, and there are no limitations on its shape. The specific laser annealing conditions may be appropriately determined by the operator, but the crystallization step according to the invention is generally carried out using a reaction of transition from a molten to solid-phase state, as described below.

In laser annealing, the conditions for the irradiated laser light (or laser beam) are optimized for heat melting of the semiconductor film, for control of the crystal nucleus generated density and the crystal growth from the crystal nucleus. In FIG. 1, region A delineated by the broken lines is the region on the thermal conductive layer 2 on which the first insulating layer 3 is formed. Region B indicates the surrounding region where the first insulating layer 3 is not formed. The pulse width of the excimer laser is from a few nsec to a few dozen nsec, such as 30 nsec, and therefore irradiation at a pulse oscillation frequency of 30 Hz results in instantaneous heating of the semiconductor film by the pulse laser light with a cooling time that is slightly longer than the heating time. The semiconductor film is melted by the laser light irradiation, but since the volume increases in region A by the amount of formation of the first insulating layer, the temperature increase is lower than in region B. On the other hand, since the heat diffuses through the thermal conductive layer 2 immediately after cessation of the laser light irradiation, region B begins to cool more rapidly and is converted to solid phase, whereas region A cools in a relatively milder fashion.

The crystal nucleus is assumed to be produced and formed by the cooling process from melted state to solid phase state, but the nucleus generating density is correlated with the melted state temperature and the cooling rate, and based on experimental observations, rapid cooling from high temperature has tended to result in a higher nucleus generating density. Consequently, the crystal nucleus generating density in region B, which undergoes rapid cooling from the melted state, is higher than in region A, and random generation of crystal nuclei forms multiple crystal grains, resulting in relatively smaller grain sizes than the crystal grains produced in region A. On the other hand, by optimizing the laser light irradiation conditions and the first insulating layer 3 and second insulating layer 4 in region A, it is possible to control the melted state temperature and the cooling rate in order to cause one generated crystal nucleus to grow into a large-sized crystal.

Lasers allowing such crystallization also include solid state lasers that are typically YAG lasers, $HYO_4$ lasers or YLF lasers. Such solid state lasers are preferably laser diode excitation lasers, with a second harmonic (532 nm), third harmonic (354.7 nm) and fourth harmonic (266 nm). The irradiation conditions may be a pulse oscillation frequency of 1–10 kHz, and a laser energy density of 300–600 mJ/cm$^2$ (typically 350–500 mJ/cm$^2$). Also, the entire surface of the substrate is irradiated with the laser beam converged into a line with a width of 100–1000 µm, or 400 µm, for example. The superposition (overlap) of the linear laser light is 80–98%.

The crystallization step need not necessarily employ laser annealing alone, and a combination of heat annealing and laser annealing may also be used. For example, after crystallization of the amorphous semiconductor film by initial heat annealing, it may be further irradiated with laser light to form the crystalline semiconductor film. The heat annealing used may be a crystallization method using a catalyst element.

In this crystallization step, the materials used for the thermal conductive layer 2 formed in close contact with the main surface of the substrate and for the first insulating layer 3 and second insulating layer 4, and their film thicknesses, must be carefully selected for the purpose of controlling the transience of the thermal conductivity. The thermal conductive layer must be of a material with a thermal conductivity of at least 10 Wm$^{-1}$K$^{-1}$ at ordinary temperature. Such materials that may be used include compounds containing one or more different components selected from among aluminum oxide, aluminum nitride, aluminum oxynitride, silicon nitride and boron nitride. Alternatively, there may be used compounds containing Si, N, O and M (where M is Al or at least one species selected from among rare earth elements).

On the other hand, the first insulating layer 3 and second insulating layer 4 employ a material with a thermal conductivity of less than 10 Wm$^{-1}$K$^{-1}$ at ordinary temperature. A silicon oxynitride film is preferred as a material having such a thermal conductivity and being suitable as a ground layer for the TFT formed on the glass substrate. A silicon nitride film or silicon oxide film may, of course, be used alternatively. However, the most preferred material is a silicon oxynitride film fabricated from $SiH_4$ and $N_2O$ by plasma CVD, for formation of the first insulating film 3 or second insulating film 4, and this composition may have an oxygen concentration of from 55 atomic % to 70 atomic % and a nitrogen concentration of from 1 atomic % to 20 atomic %.

The first insulating layer 3 is likewise formed in an insular or striped divided pattern in alignment with the position of the active layer of the TFT (the semiconductor film on which are formed the channel-forming region, source region, drain region and LDD region) on the glass substrate. Its size may be a submicron size of 0.35×0.35 μm² (channel length× channel length) to match the size of the TFT, for example, or it may be 8×8 μm², 8×200 μm² or 12×400 μm². By forming the first insulating layer 3 to match the location and size of the TFT channel-forming region, it is possible to form the channel-forming region with one crystal grain of the crystalline semiconductor film formed thereover. That is, it the same structure is obtained as by forming the channel-forming region with substantially a single crystal layer. Here, the angle of the side wall at the edge of said first insulating layer with the main surface of said substrate is preferably between 10° and 40°.

By utilizing this phenomenon, it is possible to achieve large-sized crystal grains present on the crystalline semiconductor film. The locations of the crystal grains can also be aligned with the locations forming the TFT active layer.

BRIEF DESCRIPTION OF THE DRAWINGS

FIGS. 9A–D are cross-sectional views of fabrication steps for a pixel TFT and driving circuit TFT.

FIGS. 10A–D are cross-sectional views of fabrication steps for a pixel TFT and driving circuit TFT.

FIGS. 11A–D are cross-sectional views of fabrication steps for a pixel TFT and driving circuit TFT.

PREFERRED EMBODIMENTS OF THE INVENTION

Embodiment 1

Figure 1:
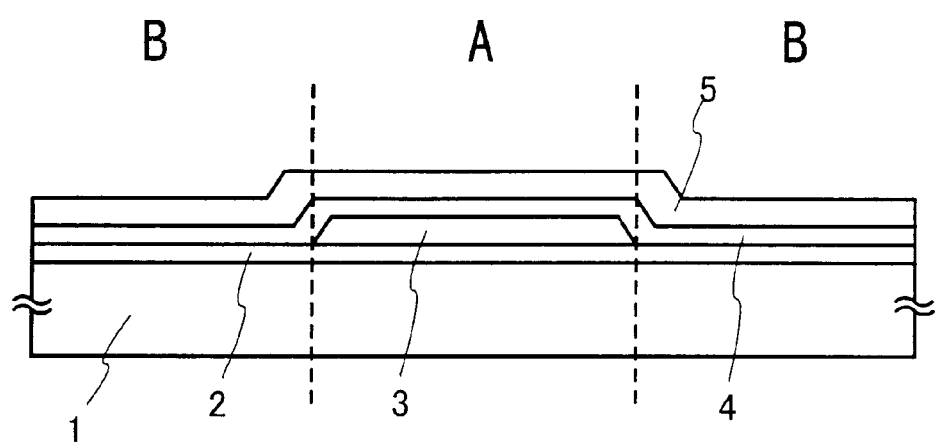
FIG. 1 is an illustration of a construction according to the invention.
Figure 2A:
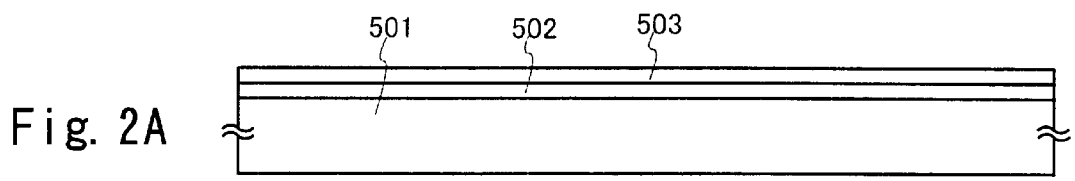
FIGS. 2A–E are cross-sectional views of fabrication steps for a crystalline semiconductor film according to the invention.

An embodiment of the invention will now be explained with reference to FIG. 2. In FIG. 2(A), an inorganic alkali glass substrate such as barium borosilicate glass or aluminoborosilicate glass is used for the substrate 501. For example, a #7059 glass substrate or #1737 glass substrate by Corning Co. may be suitably used. Such glass substrates may be heat treated beforehand at a temperature of about 10–20° C. below the glass distortion point, in order to reduce deformation by contraction of the substrate in the subsequent steps.

A translucent, insulating thermal conductive layer 502 with excellent thermal conductivity is formed on the surface of the substrate 501 on which the TFT is to be formed. The thickness of the thermal conductive layer 502 is 50–500 nm, and the thermal conductivity must be at least 10 $Wm^{-1}K^{-1}$. Such suitable materials include aluminum oxide ($Al_2O_3$) which is translucent to visible light and has a thermal conductivity of 20 $Wm^{-1}K^{-1}$. Aluminum oxide is not limited to the stoichiometric ratio, and other elements may also be added to control the properties such as the thermal conductivity and internal stress. For example, nitrogen may be included in the aluminum oxide for use as aluminum oxynitride ($AlN_xO_{1-x}$: $0.02 \leq x \leq 0.5$), and aluminum nitrides ($AlN_x$) may also be used. Compounds containing silicon (Si), oxygen (O), nitrogen (N) and M (where M is aluminum (Al) or at least one species selected from among rare earth elements) may also be used. For example, AlSiON and LaSiON may be suitably used. In addition, boron nitride and the like are also suitable for use.

The oxide, nitride or other compound may be formed by sputtering. This method employs a target with a given composition for formation by sputtering using an inert gas such as argon (Ar) or nitrogen. There may also be formed a thin-film diamond layer or DLC (Diamond-Like Carbon) layer for a thermal conductivity reaching 1000 $Wm^{-1}K^{-1}$.

The first insulating layer 503 is formed thereover. The material used for the first insulating layer has a thermal conductivity of less than 10 $Wm^{-1}K^{-1}$. The material may be selected from among silicon oxide films and silicon nitride films, but a silicon oxynitride film is preferably formed. The silicon oxynitride film is fabricated by the plasma CVD method using $SiH_4$ and $N_2O$ as the starting material gases. $O_2$ may also be added to the starting material gases. The fabrication conditions are not restricted, but a silicon oxynitride film as the first insulating film has a thickness of 50–500 nm, an oxygen concentration of from 55 atomic % to 70 atomic % and a nitrogen concentration of from 1 atomic % to 20 atomic %. This composition will reduce the internal stress of the silicon oxynitride film while also reducing the fixed charge density.

Figure 2B:
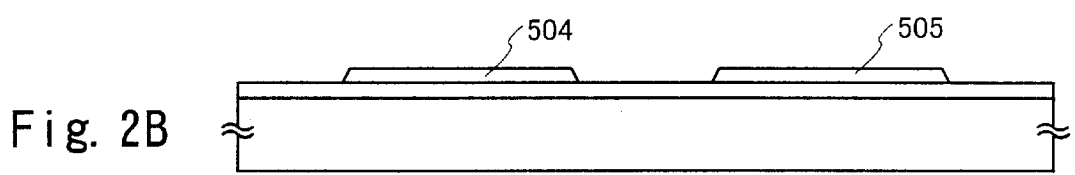

The first insulating film 503 is etched in an insular or striped fashion as shown in FIG. 2(B). The etching is carried out in a solution containing hydrogen fluoride (HF) or ammonium hydrogen fluoride (NH$_4$HF$_2$). The sizes within the insularly formed first insulating film 504, 505 are determined as appropriate. The size will depend on the use, but for example, it may be a submicron size of 0.35×0.35 $\mu$m$^2$ (channel length×channel length) to match the size of the TFT, for example, or it may be 8×8 $\mu$m$^2$, 8×200 $\mu$m$^2$ or 12×400 $\mu$m$^2$. By forming the first insulating layer 504, 505 in a manner that at least matches the location and size of the TFT channel-forming region, it is possible to form the channel-forming region with one crystal grain of the crystalline semiconductor film formed thereover. By etching into a tapered shape so that the angle of the side wall at the edge of the first insulating layer 504, 505 with the main surface of the substrate 501 is between 10° and 40°, the step coverage of the film laminated thereover is ensured. The thermal conductive film 502 and first insulating film 503, 504 fabricated in this manner will be referred to as the ground layer throughout this specification.

Next, a semiconductor film 506 with an amorphous structure is formed to a thickness of 25–80 nm (preferably 30–60 nm) by a publicly known method such as plasma CVD or sputtering. For this embodiment, an amorphous silicon film was formed to a thickness of 55 nm by plasma CVD. The semiconductor film with the amorphous structure may be an amorphous semiconductor film or a microcrystalline semiconductor film, and a compound semiconductor film having an amorphous structure, such as an amorphous silicon-germanium film, may also be used.

The amorphous semiconductor film 506 is then crystallized by laser annealing. The crystallization method used may also be rapid thermal annealing (RTA). The light source-used for RTA is an infrared lamp, halogen lamp, metal halide lamp, xenon lamp or the like. In the crystallization step, it is preferred to first discharge the hydrogen contained in the amorphous semiconductor film, and then conduct heat treatment for about one hour at 400–500° C. to reduce the hydrogen content to under 5 atomic %.

Figure 22:
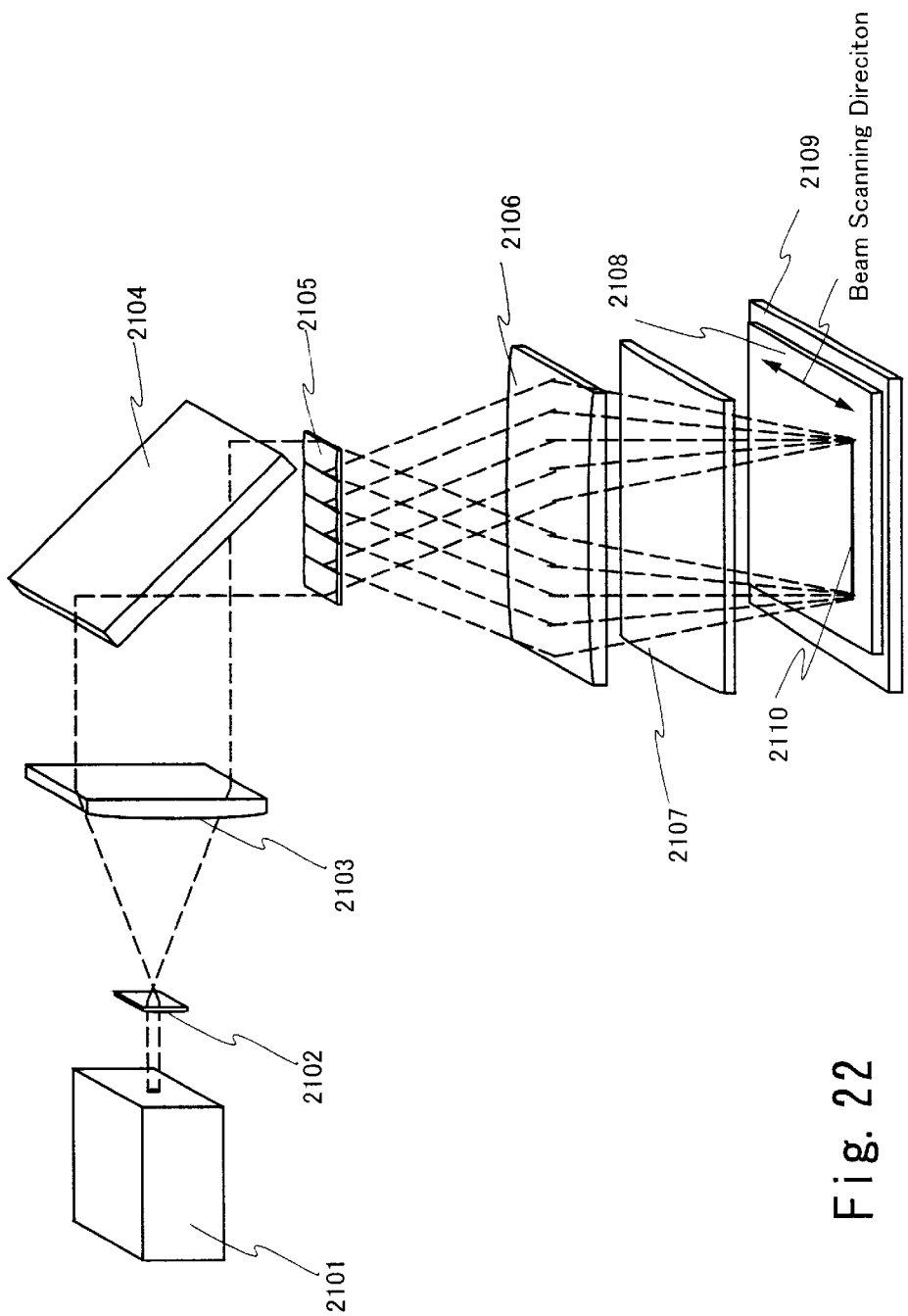
FIG. 22 is an illustration of the structure of a laser annealing apparatus.

When the crystallization is accomplished by laser annealing, the light source is a pulse oscillation type or continuous emission type excimer laser or argon laser, or a solid body laser such as a YAG laser. FIG. 22 shows the structure of such a laser annealing apparatus. An excimer laser or argon laser is used in the laser light emitting apparatus 2101. The laser beam emitted from the laser light generating apparatus 2101 is expanded in one direction by beam expanders 2102, 2103, and the laser beam reflected by a mirror 2104 is split with a cylindrical lens array 2105 and converted to a linear beam with a line width of 100–1000 $\mu$m by cylindrical lenses 2106, 2107, and irradiated to form an irradiated region 2110 on the sample side. The substrate 2108 is held on a stage 2109 in a manner allowing operation in the X direction, Y direction and θ direction. Also, by moving the stage 2109 with respect to the irradiated region 2110 it is possible to accomplish laser annealing across the entire surface of the substrate 2108. Here, the substrate 2108 may be held in an atmosphere of air, or a reaction chamber such as shown in FIG. 23 may be provided to accomplish crystallization while holding under reduced pressure or in an inert gas atmosphere.

Figure 23:
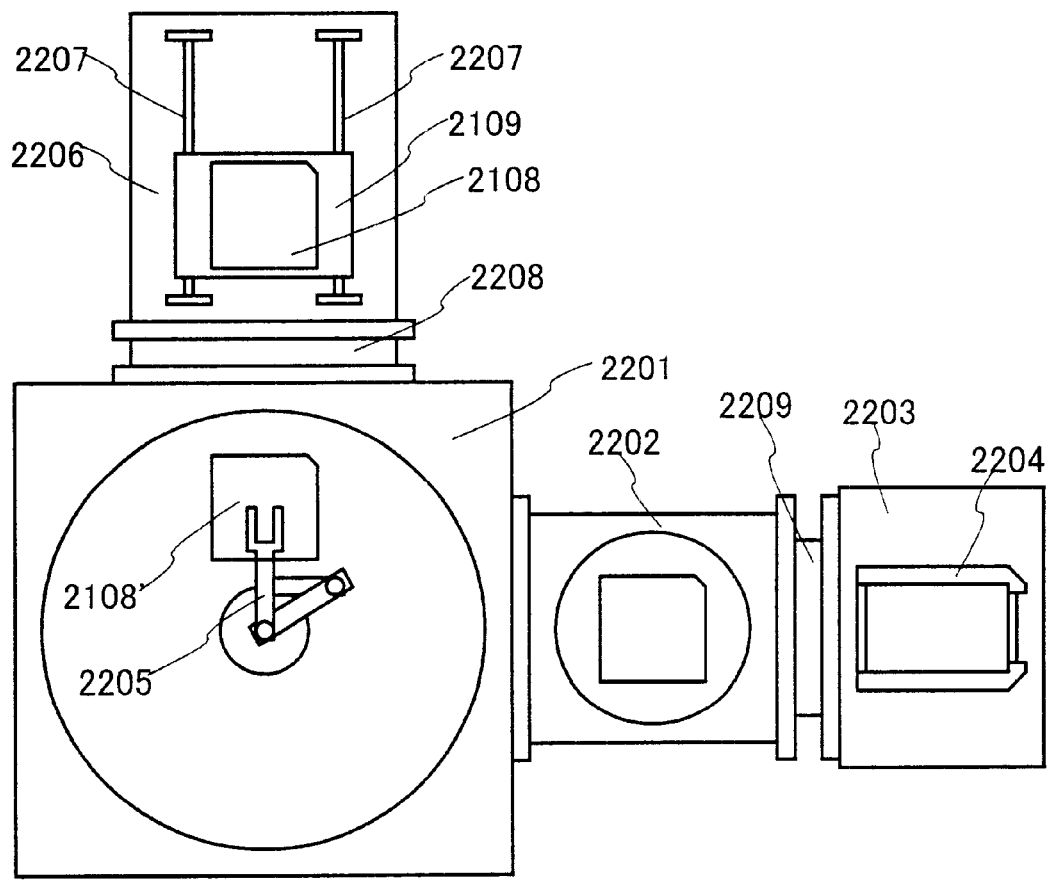
FIG. 23 is an illustration of the structure of the reaction chamber of a laser annealing apparatus.

FIG. 23 is an illustration of an embodiment relating to a method of holding a substrate in the laser annealing apparatus explained with reference to FIG. 22. The substrate 2108 held on the stage 2109 is set in the reaction chamber 2206. The reaction chamber interior may be brought under reduced pressure or an inert gas atmosphere with a vacuum system or gas system (not shown), and the stage 2109 may be moved in the reaction chamber along a guide rail 2207. The laser light enters through a quartz window (not shown) provided over the substrate 2108. With this construction, it is possible to heat the substrate 2108 to 300–500° C. with heating means (not shown) provided on the stage 2109. In FIG. 23, a transfer chamber 2201, intermediate chamber 2202 and load/unload chamber 2203 are connected with the reaction chamber 2206, and separated therefrom with partitioning valves 2208, 2209. In the load/unload chamber 2203 there is placed a cassette 2204 capable of holding multiple substrates, and the substrates are conveyed by a conveying robot 2205 provided in the transfer chamber 2201. The substrate 2108' is a substrate being conveyed. This type of construction allows continuous treatment by laser annealing under reduced pressure or in an inert gas atmosphere.

The laser annealing conditions are appropriately selected by the operator, for example, with an excimer laser pulse oscillation frequency of 30 Hz and a laser energy density of 100–500 mJ/cm$^2$ (typically 300–400 mJ/cm$^2$). A linear beam with a line width of 100–1000 $\mu$m, for example a line width of 400 $\mu$m, is irradiated across the entire surface of the substrate. Since this line width is larger than the insularly formed first insulating film, the amorphous silicon layer on the first insulating film may be crystallized with irradiation of one pulse of the linear beam. Also, multiple irradiations may be effected while scanning the linear beam. The superposition (overlap) of the linear beam at this time may be 50–98%. The same treatment may be carried out even if the shape of the laser beam is planar.

Figure 2C:
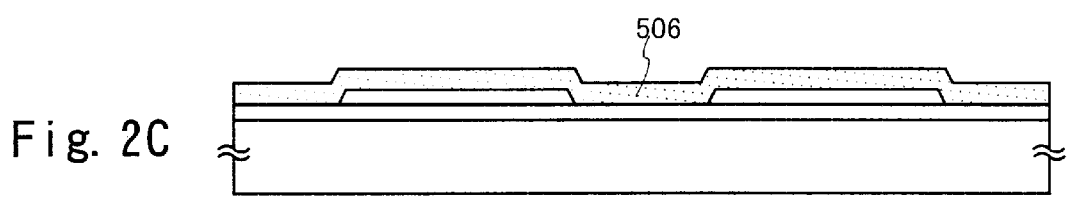
Figure 2D:
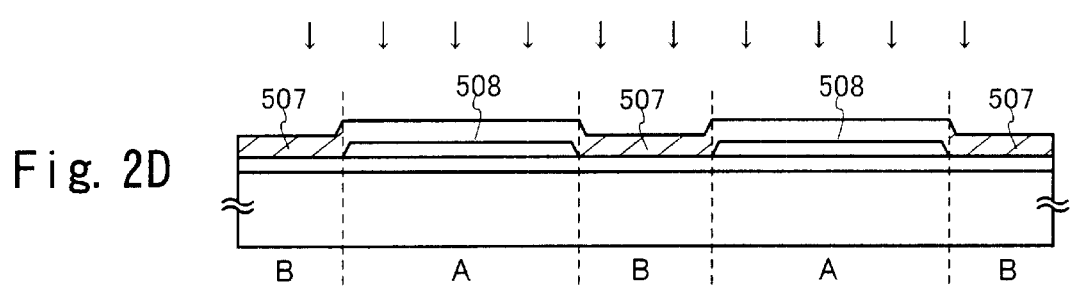
Figure 2E:
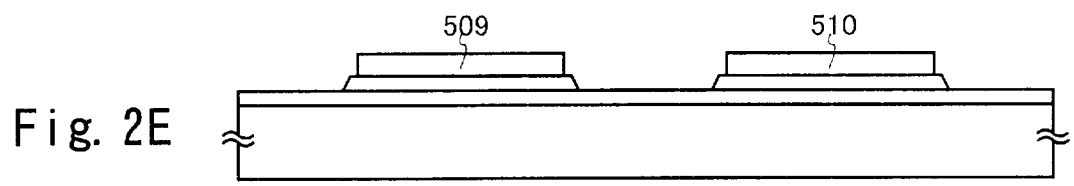

If the pulse oscillation frequency of the excimer laser is 30 Hz, the pulse width will be from a few nsec to a few dozen nsec, such as 30 nsec, and therefore irradiation of a pulse linear laser beam on the amorphous silicon film results in instantaneous heating, with a cooling time that is slightly longer than the heating time. At that time, as shown in FIG. 2(D), if the region in which the first insulating film is formed is designated as region A and the other region as region B, the volume increases in region A by the amount of formation of the first insulating layer, and therefore the temperature increase due to laser beam irradiation is lower than in region B. On the other hand, since the heat diffuses through the thermal conductive layer 502 immediately after cessation of the laser beam irradiation, region B cools more rapidly.

When a continuous emission type excimer laser is used as the laser emitting apparatus 2101, the same optical system is used. For example, if a continuous emission type excimer laser with an output of 1000 W is used, the optical system may be used to create a 400 $\mu$m×125 mm linear beam for scanning of the entire substrate surface at a scanning rate of 0.1–10 m/sec.

With laser annealing, the conditions of the irradiating laser beam are optimized to control the crystal nucleus generating density and crystal growth from the crystal nuclei. Since temperature change during heating and cooling in region A is relatively milder, growth of the crystal grains occurs from the center of the semiconductor film 508 in region A, allowing growth of a single crystal across almost the entire surface of the first insulating layer 504, 505. On the other hand, since region B cools more rapidly, only small crystal grains grow in the semiconductor film 507 in region B, giving a structure with aggregates of a plurality of crystal grains. It is thus possible to form a crystalline semiconductor film with controlled crystal grain locations.

A photoresist pattern may then be formed on region A of the formed crystalline semiconductor film, and the crystalline silicon film on region B selectively removed by dry etching to form an insular semiconductor layer 509, 510. A $CF_4$ and $O_2$ mixed gas may be used for the dry etching. The insular semiconductor layer 509, 510 fabricated in this manner has a residual defect level of $10^{16}$–$10^{18}$/cm$^3$, and therefore it may be subjected to heat treatment at a temperature of 300–450° C. in a hydrogen atmosphere, a nitrogen atmosphere containing 1–3% hydrogen or an atmosphere containing hydrogen produced by plasma heating, for the step of hydrogenation. With the hydrogenation step, hydrogen is added to the insular semiconductor layer 509, 510 at about 0.01–01 atomic %. Thus, an insular semiconductor layer 509, 510 is formed by a single crystal grain and is substantially equivalent to a single crystal, so that formation of an element such as a TFT on that section can provide characteristics comparable to a MOS transistor formed on a single crystal silicon substrate.

Embodiment 2

Figure 3:
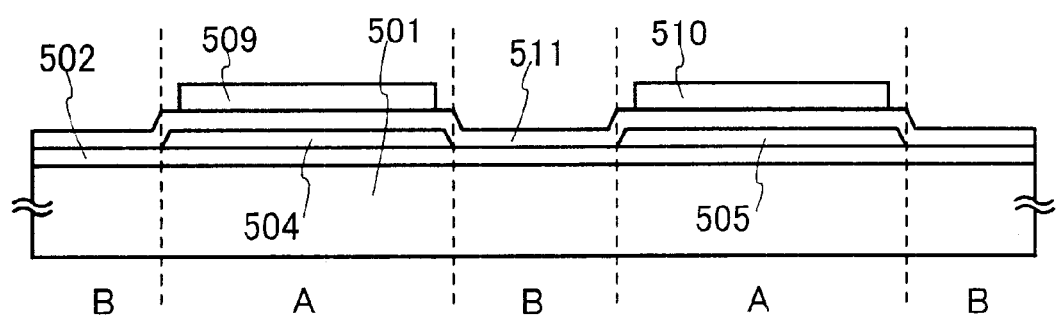
FIG. 3 is a cross-sectional view of a crystalline semiconductor film according to the invention.

In the embodiment shown in FIG. 3, a thermal conductive layer 502 is formed on a substrate 501 and a first insulating layer 504, 505 is formed thereover in the same manner as Embodiment 1. Next, a second insulating layer 511 is formed on the thermal conductive layer and the first insulating layer. The second insulating layer may also be formed of a silicon oxynitride film, as the first insulating layer. An insular semiconductor layer 509, 510 may be formed on the second insulating layer 511 by the same procedure as in Embodiment 1.

The film thickness of the second insulating layer 511 is altered to allow control of the rate at which heat diffuses from the semiconductor film to the substrate. Since aluminum nitride and similar compounds have relatively large internal stress, though it depends on the type of material used as the heat conductive layer and the fabrication conditions, the influence thereof generates distortion at the interface with the semiconductor film, which sometimes adversely affects crystallization; however, if a low internal stress silicon oxynitride film is formed such as shown in FIG. 3, it is possible to alleviate that adverse effect. In this case, the thickness of the second insulating layer may be 5–100 nm.

Embodiment 3

The fabrication method for a crystalline semiconductor film to serve as a TFT active layer is not limited only to laser annealing, as laser annealing may be used in combination with heat annealing. For example, the same effect may be achieved if a substrate on which is formed a semiconductor film 506 having an amorphous structure (amorphous silicon film) in the state shown in FIG. 2(C) is heated at about 600–670° C. for about 4–12 hours using a furnace annealer for crystallization, and then treated by the laser annealing method explained in Embodiment 1. Crystallization by heat annealing can also be applied as a crystallization method using the catalyst element disclosed in Japanese Laid-Open Patent Publication No. 130652 of 1995.

Figure 4A:
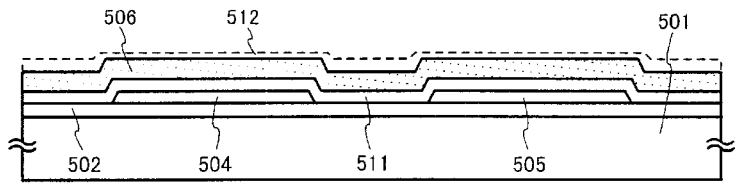
FIGS. 4A–F are cross-sectional views of fabrication steps for a crystalline semiconductor film according to the invention.

As shown in FIG. 4(A), a thermal conductive layer 502 is formed on a glass substrate 501 and a first insulating layer 504, 505 is formed thereover in the same manner as Embodiment 1. A second insulating layer 511 may also be formed in the same manner as Embodiment 2, or this layer may be omitted. An amorphous semiconductor film 506 is then formed to a thickness of 25–80 nm by plasma CVD or sputtering. For example, an amorphous silicon film is formed to a thickness of 55 nm. An aqueous solution containing 10 ppm of a catalyst element in terms of weight is applied by spin coating to form a catalyst element-containing layer 512. The catalyst element may be nickel (Ni), germanium (Ge), iron (Fe), palladium (Pd), tin (Sn), lead (Pb), cobalt (Co), platinum (Pt), copper (Cu), gold (Au) or the like. The catalyst element-containing layer 512 may be formed to a thickness of 1–5 nm as a catalyst element layer by sputtering or vapor deposition instead of spin coating.

By selectively forming the first insulating layer 504, 505 it is possible to form irregularities on the surface of the amorphous semiconductor film 506. When an aqueous solution containing the catalyst element is applied by spin coating to form the catalyst element-containing layer 512, the thickness of the catalyst element-containing layer 512 is not uniform, being relatively thicker at the trench regions in which the first insulating layer is not formed. This results in a greater concentration of the catalyst element diffusing into the semiconductor film in the subsequent heat annealing step.

Figure 4B:
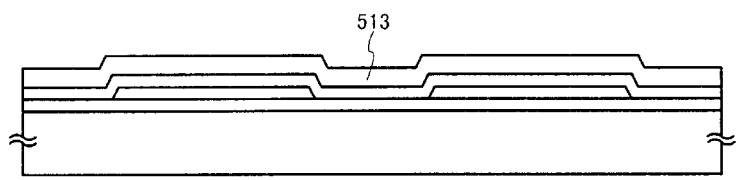

In the crystallization step shown in FIG. 4(B), first heat treatment is carried out at 400–500° C. for about one hour to reduce the hydrogen content of the amorphous silicon film to 5 atomic %. A furnace annealer is then used for heat annealing in a nitrogen atmosphere at 550–600° C. for 1–8 hours. Such a crystalline silicon film can be obtained by this step. However, the crystalline semiconductor film 513 fabricated by the heat annealing up to this step comprises multiple crystal grains as observed microscopically with a transmission electron microscope, and the sizes and locations of the crystal grains are not uniform but random. Also, Raman spectroscopic observation shows local residue of amorphous regions.

Figure 4C:
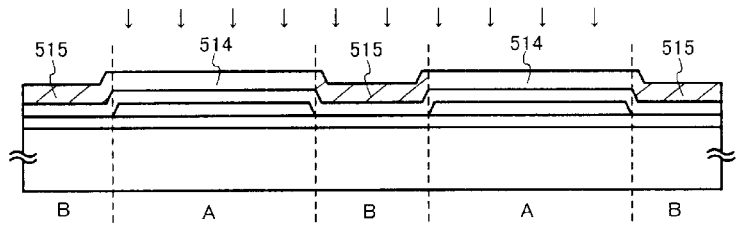

It is effective to control the crystal grains of this crystalline semiconductor film 513 to form them in prescribed locations, while accomplishing laser annealing at this stage in order to achieve large-sized crystals. With laser annealing, the crystalline semiconductor film 513 is first melted and then recrystallized, thus allowing the aforementioned object to be achieved. For example, an XeCl excimer laser (wavelength: 308 nm) is used to form a linear beam with an optical system, and irradiation is performed with an oscillation frequency of 5–50 Hz, an energy density of 100–500 mJ/cm$^2$ and a linear beam overlap of 80–98%. Here, as shown in FIG. 4(C), in region A where the first insulating layer 504, 505 is formed and in the surrounding region B, there is a difference in the maximum temperature of heating by the laser beam irradiation and in the cooling rate after irradiation, so that large crystal grains easily grow in region A while the rapid cooling in region B can only grow small crystal grains. Thus, it is possible to form a crystalline semiconductor film in which the locations of the large grains are controlled.

In this manner, the crystalline semiconductor film 514 formed and fabricated on the first insulating layer can produce an approximately single crystal in that region. The rest of the crystalline semiconductor film 515 is a region formed by relatively small and randomly-sized crystal grains. However, in this state, the concentration of the catalyst element remaining on the surface of the crystalline semiconductor film 514, 515 is $3 \times 10^{10}$–$2 \times 10^{11}$ atoms/cm$^2$.

Figure 4D:
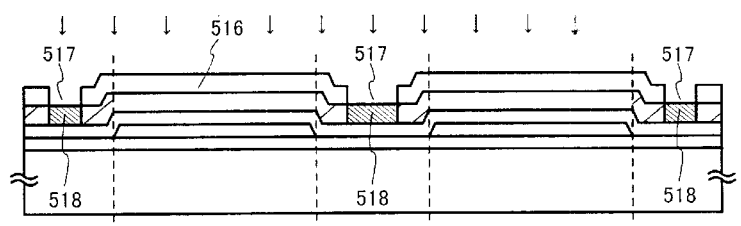
Figure 4E:
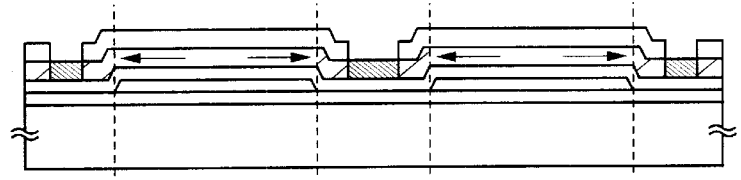
Figure 4F:
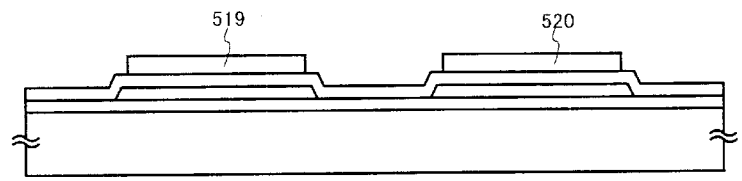

Here, a step of gettering may be carried out, as disclosed in Japanese Laid-Open Patent Publication No. 247735 of 1998. The gettering step can reduce the concentration of the catalyst element in the crystalline silicon film to under $1\times10^{17}$ atoms/cm$^3$, and preferably to $1\times10^{16}$ atoms/cm$^3$. First, as shown in FIG. 4(D), a mask insulating film cover 516 is formed on the surface of the crystalline semiconductor film 514, 515 to a thickness of 150 nm, and holes 517 are formed by patterning, thus exposing the crystalline silicon film. A step of phosphorus addition is also carried out to provide a phosphorus-containing region 518 in the crystalline silicon film. In this state, as shown in FIG. 4(E), with heat treatment in a nitrogen atmosphere at 500–800° C. (preferably 500–550° C.) for 5–24 hours, for example at 525° C. for 12 hours, the phosphorus-containing region 518 acts as a gettering site, to allow segregation of the catalyst element remaining in the crystalline silicon film 514, 515 into the phosphorus-containing region 518. Also, by removing the mask insulating film cover 516 and phosphorus-containing region 518 and forming an insular semiconductor layer 519, 520 as shown in FIG. 4(F), it is possible to obtain a crystalline silicon film with the concentration of the catalyst element used in the crystallization step reduced to $1\times10^{17}$ atoms/cm$^3$.

Thus, by carrying out a step of crystallization by laser annealing according to the invention on a crystalline silicon film fabricated by heat annealing whereby the catalyst element is heated, it is possible to obtain a crystalline semiconductor film with larger crystal grains than by the step of crystallization with only the laser annealing shown for Embodiment 1. However, since a defect level of $10^{16}$–$10^{18}$/cm$^3$ remains in the fabricated insular semiconductor layer 519, 520, it may be subjected to heat treatment at a temperature of 300–450° C. in a hydrogen atmosphere, a nitrogen atmosphere containing 1–3% hydrogen or an atmosphere containing hydrogen produced by plasma heating, for a step of hydrogenation to reduce the defect density to under $10^{16}$/cm$^3$. With the hydrogenation step, hydrogen is added to the insular semiconductor layer 519, 520 at about 0.01–0.1 atomic %.

EXAMPLES

Example 1

In this example, a step of fabricating a CMOS circuit comprising an n-channel type TFT and p-channel type TFT will be explained with reference to FIGS. 5 and 6.

Figure 5A:
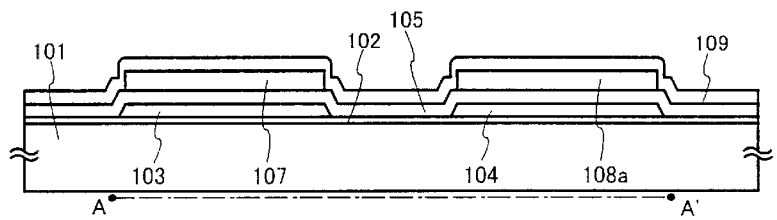
FIGS. 5A–E are cross-sectional views of fabrication steps for a TFT.

In FIG. 5(A), the substrate 101 used is barium borosilicate glass or aluminoborosilicate glass, typical examples of which are #7059 glass and #1737 glass. It may be heat treated beforehand at a temperature of about 10–20° C. below the glass distortion point, in order to reduce deformation by contraction of the substrate in the subsequent steps. At least one translucent, insulating thermal conductive layer 102 is formed on the surface of the substrate 101 on which the TFT is to be formed. It is formed with aluminum oxynitride (AlN$_x$O$_{1-x}$: $0.02 \leq x \leq 0.5$) to a thickness of 50–500 nm. It may also be formed of Si, N, O or M (where M is at least one element selected from among Al, Y, La, Gd, Dy, Nd, Sm and Er), for example, AlSiON or LaSiON. This thermal conductive layer can be formed by sputtering. A target with a given composition may be used for formation by sputtering using an inert gas such as argon (Ar) or nitrogen. There may also be formed a thin-film diamond layer or DLC (Diamond-Like Carbon) layer for a thermal conductivity reaching 1000 Wm$^{-1}$K$^{-1}$.

A silicon oxynitride film is formed to a thickness of 50–500 nm, with fabrication from SiH$_4$ and N$_2$O by the plasma CVD method, and partial etching is performed in a solution containing hydrogen fluoride (HF) and ammonium hydrogen fluoride (NH$_4$HF$_2$), to form an insular first insulating film 103, 104. The oxygen concentration of the first insulating film is from 55 atomic % to 70 atomic % and the nitrogen concentration is from 1 atomic % to 20 atomic %. This composition will reduce the fixed charge density in the film while also producing a denser film.

The size of the insularly formed first insulating film 103, 104 is the same size or slightly larger than the insular semiconductor layer to be formed as the active layer in a subsequent step. Alternatively, it may be the same size or slightly larger than the TFT channel-forming region. The size of the insular semiconductor layer will be appropriately determined based on the required TFT characteristics, and for example, it may be 20 $\mu$m×8 $\mu$m (length in channel length direction×length in channel width direction), or other sizes such as 28 $\mu$m×30 $\mu$m or 45 $\mu$m×63 $\mu$m. Consequently, the outer dimensions of the first insulating film 103, 104 is matched to the respective sizes of the insular semiconductor layer, at the same size or about 1–20% larger. Taper etching is performed so that the angle of the side wall at the edge of the first insulating layer 103, 104 is from 10° to 40° with the main surface of the glass substrate, to guarantee a step or barege for the film laminated thereover.

A second insulating film 105 is also formed comprising a silicon oxynitride film that is fabricated from SiH$_4$ and N$_2$O by plasma CVD. The composition of the silicon oxynitride film has an oxygen content of from 55 atomic % to 65 atomic % and a nitrogen content of from 1 atomic % to 20 atomic %, whereby the internal stress is reduced to avoid direct stress on the semiconductor layer formed thereover. The second insulating layer is formed to a thickness of 10–200 nm (preferably 20–100 nm). The second insulating layer can be omitted as shown in Embodiment 1.

Next, a semiconductor layer with an amorphous structure is formed by a publicly known method such as plasma CVD or sputtering to a thickness of 25–80 nm (preferably 30–60 nm). For example, an amorphous silicon film is formed to a thickness of 55 nm by plasma CVD. The semiconductor film having an amorphous structure may be an amorphous semiconductor film or a microcrystalline semiconductor film, and a compound semiconductor film having an amorphous structure, such as an amorphous silicon-germanium film, may also be used. Also, of the ground layers, both the second insulating layer and the amorphous semiconductor layer may be formed continuously.

One of the methods described for Embodiments 1–3 is selected to form the crystalline semiconductor film (in this case, a crystalline silicon film), and etching treatment is performed to form an insular semiconductor layer 107, 108a. The etching treatment is accomplished by dry etching, using a mixed gas of CF$_4$ and O$_2$. The insular semiconductor layer 107, 108a each consists of a single crystal grain, and the pattern formed layer by etching was considered to be substantially a single crystal. Next, a mask layer 109 is formed by a silicon oxide film with a thickness of 50–100 nm by plasma CVD, reduced pressure CVD or sputtering. For example, in the case of plasma CVD, tetraethyl orthosilicate (TEOS) and O$_2$ are mixed, and the film is formed to a thickness of 100–150 nm, typically 130 nm, at a reaction pressure of 40 Pa, a substrate temperature of 300–400° C., and discharge at a high frequency (13.56 MHz) current density of 0.5–0.8 W/cm$^2$.

Figure 7A:
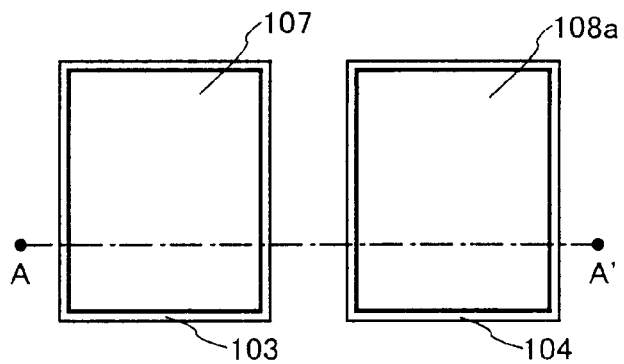
FIGS. 7A–C are cross-sectional views of fabrication steps for a TFT.

FIG. 7(A) shows a top view of FIG. 5(A). In FIG. 7(A), the mask layer and first and second insulating films are omitted. The insular semiconductor layer 107, 108b are provided so that the insular pattern-formed first insulating layer 103, 104 portions each overlap. In FIG. 7(A), cross-section A–A' corresponds to the cross-sectional structure shown in FIG. 5(A).

Figure 5B:
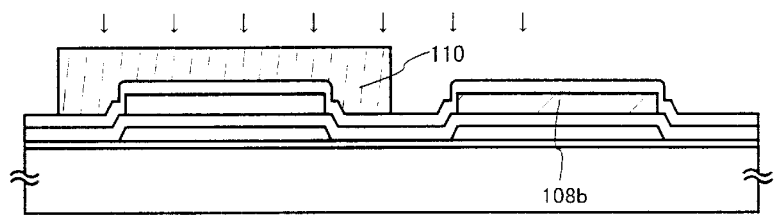
Figure 5C:
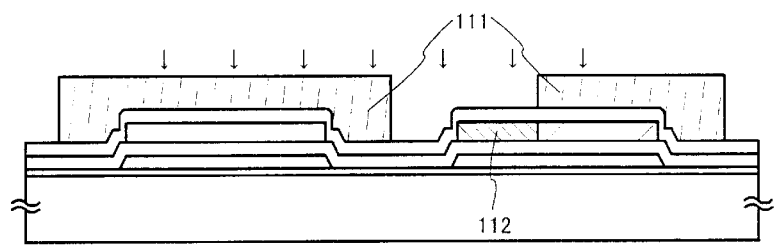
Figure 5D:
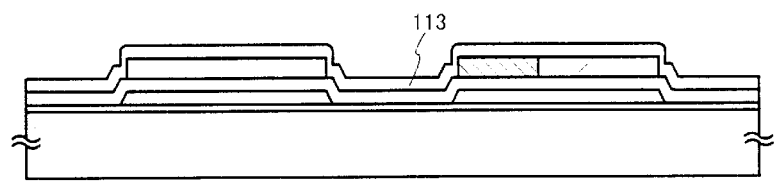

A photoresist mask 110 is provided as shown in FIG. 5(B), and a p-type impurity element is added to a concentration of about $1 \times 10^{16}$ to $5 \times 10^{17}$ atoms/cm$^3$ for the purpose of controlling the threshold voltage of the insular semiconductor layer 108a on which the n-channel type TFT is to be formed. Elements of Group 13 of the Periodic Table such as boron (B), aluminum (Al) and germanium (Ge) are known as p-type impurity elements for semiconductors. Here, diborane ($B_2H_6$) was used for addition of boron (B) by ion doping. The boron (B) addition is not always necessary and may be omitted, but a semiconductor layer 108b containing boron (B) can be formed to limit the threshold voltage of the n-channel type TFT to within the prescribed range.

For formation of an n-channel type TFT LDD region, an n-type impurity element is selectively added to the insular semiconductor layer 108b. Elements of Group 15 of the Periodic Table such as phosphorus (P), arsenic (As) and antimony (Sb) are known as n-type impurity elements. A photoresist mask 111 is formed, and in this case ion doping was applied using phosphine ($PH_3$) in order to add phosphorus (P). The phosphorus (P) concentration of the formed impurity region 12 is in the range of $2 \times 10^{16}$ to $5 \times 10^{19}$ atoms/cm$^3$ (FIG. 5(C)). Throughout this specification, the concentration of the n-type impurity element included in the impurity region 112 will be indicated as (n$^-$).

Next, the mask layer 109 was removed with an etching solution of hydrofluoric acid diluted with purified water. In FIGS. 5(B) and (C), a step of activating the impurity element added to the insular semiconductor layer 108b is carried out. The activation may be carried out by a method such as heat annealing for 1–4 hours at 500–600° C. in a nitrogen atmosphere, or by a different method such as laser annealing. Both methods may also be used in combination. In this example, a laser activating method was used, with an excimer laser employed to form a linear beam at an oscillation frequency of 5–50 Hz, an energy density of 100–500 mJ/cm$^2$ and a linear beam overlap of 80–98%, for treatment of the entire surface of the substrate on which the insular semiconductor layer had been formed. There are no particular restrictions on the laser light irradiation conditions, and they may be appropriate determined by the operator.

A gate insulating film 113 is formed of an insulating film containing silicon to a film thickness of 40–150 nm using plasma CVD or sputtering. For example, it may be formed with the same silicon oxynitride film as the first insulating film, to a thickness of 120 nm. A silicon oxynitride film fabricated with addition $O_2$ to $SiH_4$ and $N_2O$ is even more satisfactory because the fixed charge density of the film is reduced. The gate insulating film is not limited to such a silicon oxynitride film, and another type of silicon-containing insulating film may be used with a single layer or laminated structure (FIG. 5(D)).

Figure 5E:
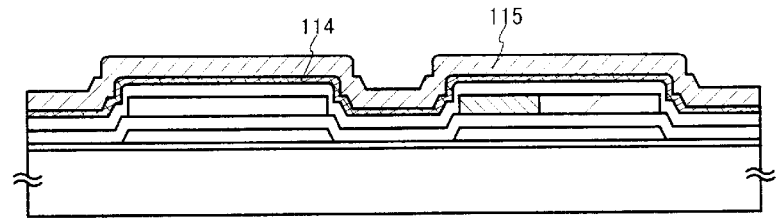

As shown in FIG. 5(E), a conductive layer is formed on the gas insulating film for formation of a gate electrode. This conductive layer may be formed as a single layer, or if necessary it may be a double or triple laminated structure. For this example, the structure was a laminate of conductive layer (A) 114 made of a conductive metal nitride film and conductive layer (B) 115 made of a metal film. The conductive layer (B) 115 may be formed of an element selected from among tantalum (Ta), titanium (Ti), molybdenum (Mo) and tungsten (W), or an alloy composed mainly of such an element, or an alloy film with a combination of these elements (typically a Mo—W alloy film or Mo—Ta alloy film), and the conductive layer (A) 114 may be formed of tantalum nitride (TaN), tungsten nitride (WN), titanium nitride (TiN), molybdenum nitride (MoN) or the like. The conductive layer (A) 114 may also employ tungsten silicide, titanium silicide or molybdenum silicide. The conductive layer (B) 115 may have a reduced impurity concentration in order to achieve lower resistance, and an oxygen concentration of 30 ppm or lower was found to be particularly satisfactory. For example, with tungsten (W) it is possible to realize a low resistance value of under 20 $\mu\Omega$cm if the oxygen concentration is 30 ppm or lower.

The conductive layer (A) 114 may be 10–50 nm (preferably 20–30 nm) and the conductive layer (B) 115 may be 200–400 nm (preferably 250–350 nm). In this example, a TaN film with a thickness of 30 nm was used as the conductive layer (A) 114 and a 350 nm Ta film was used as the conductive layer (B) 115, both of which were formed by sputtering. The TaN film was made using a mixed gas of Ar and nitrogen as the sputtering gas, and Ta as the target. Ar was used as the sputtering gas for Ta. By adding a sufficient amount of Xe or Kr to the sputtering gases, it is possible to alleviate internal stress of the formed films and prevent separation of the films. The resistivity of an α-phase Ta film is about 20 $\mu\Omega$cm and it can therefore be used as a gate electrode, but the resistivity of a β-phase Ta film is about 180 $\mu\Omega$cm and it is therefore unsuitable as a gate electrode. The TaN film has a nearly -phase crystal structure, and therefore formation of a Ta film thereover can easily give an α-phase Ta film. While not shown in the drawings, it is effective to form a silicon film doped with phosphorus (P), to a thickness of about 2–20 nm under the conductive layer (A) 114. This can improve cohesion and prevent oxidation of the conductive film formed thereover while also preventing diffusion of the trace alkali metal elements in the conductive layer (A) and conductive layer (B) into the gate insulating film 113. In any case, the conductive layer (B) preferably has a resistivity in the range of 10–500 $\mu\Omega$cm.

Next, a photoresist mask with the desired pattern is formed, and the conductive layer (A) 114 and conductive layer (A) 114 are etched together to form gate electrodes 116, 117. For example, a mixed gas of $CF_4$ and $O_2$, or $Cl_2$, is used for dry etching at a reaction pressure of 1–20 Pa. The gate electrodes 116, 117 are formed by integration of 116a, 117a made of the conductive layer (A) and 116b, 117b made of the conductive layer (B). Here, the gate electrode 117 provided with an n-channel type TFT overlaps with a portion of the impurity region 112 via the gate insulating film 113. The gate electrodes may also be formed of the conductive layer (B) alone (FIG. 6(A)).

Figure 6A:
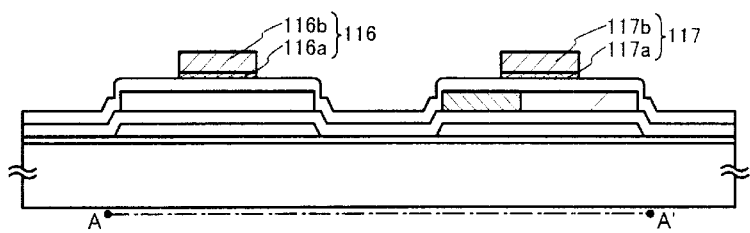
FIGS. 6A–E are cross-sectional views of fabrication steps for a TFT.
Figure 6B:
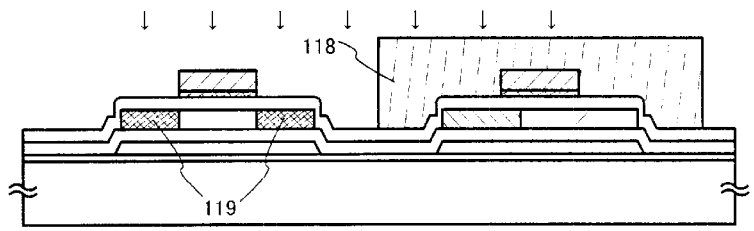
Figure 6C:
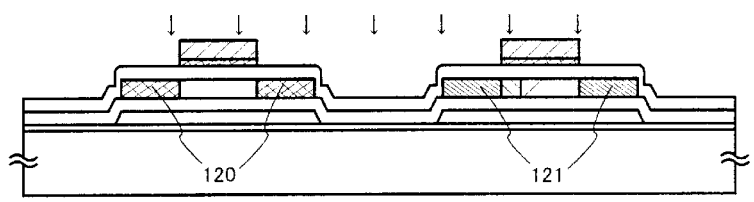
Figure 6D:
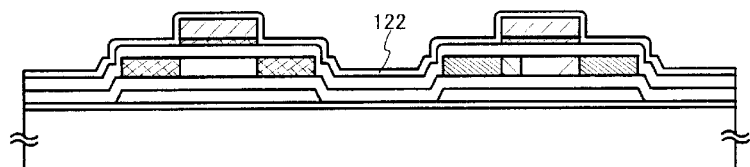
Figure 7B:
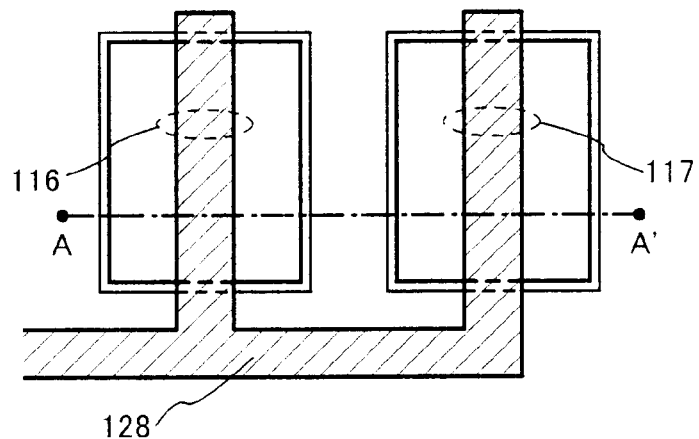

FIG. 7(B) shows a top view of FIG. 6(A). In FIG. 7(B), the gate insulating film and the first and second insulating films are omitted. The gate electrodes 116, 117 provided on the insular semiconductor layers 107, 108b via the gate insulating film are connected to a gate wiring 128. In FIG. 7(B), cross-section A–A' corresponds to the cross-sectional structure shown in FIG. 6(A).

Next, an impurity region 119 is formed as a source region and drain region in the insular semiconductor layer 107 on which the p-channel type TFT is to be formed. Here, the gate electrode 116 is used as a mask for addition of a p-type impurity element, to form a self-aligning impurity region. The insular semiconductor layer 108b in which the n-channel type TFT is to be formed is covered at this time with a photoresist mask 118. The impurity region 119 is formed by an ion doping method using diborane ($B_2H_6$). The boron (B) concentration of this region is $3\times10^{20}$ to $3\times10^{21}$ atoms/cm$^3$ (FIG. 6(B)). Throughout this specification, the concentration of the p-type impurity element in the impurity region 134 formed here will be represented as (p$^+$).

Next, an impurity region 121 to form a source region or drain region was formed in the insular semiconductor layer 108b on which the n-channel type TFT was to be formed. This was accomplished by an ion doping method using phosphine (PH$_3$), and the phosphorus (P) concentration in the region was in the range of $1\times10^{20}$ to $1\times10^{21}$ atoms/cm$^3$ (FIG. 6(C)). Throughout the present specification, the concentration of the n-type impurity element in the impurity region 121 formed here will be represented as (n$^+$). Phosphorus (P) is also added simultaneously to the impurity region 119, but since the concentration of phosphorus (P) added to the impurity region 117 is about ½ to ⅓ of the boron (B) concentration already added in the previous step, the p-type conductivity is guaranteed so that there is no effect on the properties of the TFT.

This was followed by a step of heat annealing for activation of the n-type or p-type impurity element added in to their respective concentrations. This step can be accomplished by furnace annealing. It may also be accomplished by laser annealing or rapid thermal annealing (RTA). The annealing treatment is carried out in a nitrogen atmosphere with an oxygen concentration of no greater than 1 ppm and preferably no greater than 0.1 ppm, at 400–700° C. and typically 500–600° C., and for this example heat treatment was carried out at 550° C. for 4 hours. Prior to the annealing treatment, a protective insulating layer 122 with a thickness of 50–200 nm may be formed of a silicon oxynitride film or silicon oxide film. The silicon oxynitride film may be formed under any of the conditions listed in Table 1, or it may be formed with SiH$_4$ at 27 SCCM, N$_2$O at 900 SCCM, a reaction pressure of 160 Pa, a substrate temperature of 325° C. and a discharge current density of 0.1 W/cm$^2$ (FIG. 6(D)).

After the activation step, a step was performed for hydrogenation of the insular semiconductor layer by heat treatment at 300–450° C. for 1–12 hours in an atmosphere containing 3–100% hydrogen. This step is a step for terminating the $10^{16}$–$10^{18}$ cm$^3$ dangling bond of the insular semiconductor layer by thermally excited hydrogen. Plasma hydrogenation (using plasma-excited hydrogen) may also be carried out as another means for hydrogenation.

After completion of the steps of activation and hydrogenation, an interlayer insulating film 123 is formed by laminating a silicon oxynitride film or silicon oxide film on the protective insulating film. The silicon oxynitride film is formed to a thickness of 500–1500 nm (preferably 600–800 nm) in the same manner as the insulating film 119, with SiH$_4$ at 27 SCCM, N$_2$O at 900 SCCM, a reaction pressure of 160 Pa, a substrate temperature of 325° C. and a discharge current density of 0.15 W/cm$^2$. Contact holes are formed reaching to the TFT source region or drain region of the interlayer insulating film 123 and protective insulating film 122, forming source wirings 124–125 and a drain wiring 126. While not shown here, in this example the electrode has a three-layer laminated structure with continuous formation of a Ti film to 100 nm, a Ti-containing aluminum film to 300 nm and a Ti film to 150 nm by sputtering.

Next, a silicon nitride film, silicon oxide film or a silicon oxynitride film is formed to a thickness of 50–500 nm (typically 100–300 nm) as a passivation film 127. Hydrogenation treatment in this state gave favorable results for enhancement of the TFT characteristics. For example, heat treatment may be carried out for 1–12 hours at 300–450° C. in an atmosphere containing 3–100% hydrogen, or a similar effect may be achieved by using a plasma hydrogenation method. This heat treatment can also cause diffusion of the hydrogen present in the interlayer insulating layer 123 and protective insulating layer 122 into the insular semiconductor layer 107, 108b for hydrogenation. In any case, it is preferred to reduce the defect density of the insular semiconductor layer 107, 108b to under $10^{16}$/cm$^3$, and it was found that inclusion of hydrogen to 0.01–0.1 atomic % was satisfactory for this purpose.

Figure 6E:
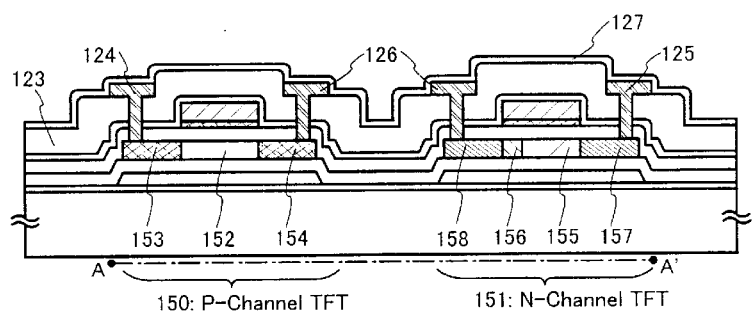

It was thus possible to complete an n-channel type TFT 151 and a p-channel type TFT 150 on a substrate 101, as shown in FIG. 6(E). The p-channel type TFT 150 has a channel-forming region 152, source region 153 and drain region 154 on the insular semiconductor layer 107. Then n-channel type TFT 151 has a channel-forming region 155, an LDD region 156 overlapping the gate electrode 177 (this LDD region will hereunder be referred to as L$_{ov}$), a source region 157 and a drain region 158 on the insular semiconductor layer 108. The length of the L$_{ov}$ region in the channel length direction is 0.5–3.0 μm (preferably 1.0–1.5 μm), compared to 3–8 μm for the channel length. In FIG. 2, each TFT has a single gate structure, but it may be a double gate structure and there is also no problem with a multigate structure comprising multiple gate electrodes.

Figure 7C:
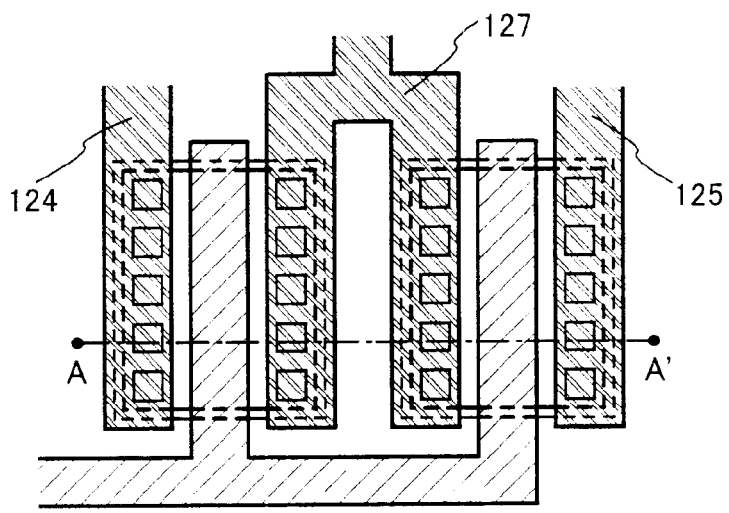

FIG. 7(C) shows a top view of FIG. 6(E). The source wirings 124, 125 are in contact with the insular semiconductor layer 107, 108b with contact holes not shown, provided on the interlayer insulating layer 123 and protective insulating layer 122. In FIG. 7(C), cross-section A–A' corresponds to the cross-sectional structure shown in FIG. 6(E).

The p-channel type TFT 150 and n-channel type TFT 151 fabricated in this manner are formed of a channel-forming region that is a single crystal grain, or single crystal. As a result, since the current conveying characteristics during operation of the TFT are not affected by grain boundary potential or trapping, it is possible to achieve properties comparable to a MOS transistor formed on a single crystal silicon substrate. This type of TFT can also be used to form a shift register circuit, buffer circuit, D/A converter circuit, level shifter circuit, multiplexer circuit or the like. Appropriate combination of these circuits can applied to form various semiconductor devices fabricated on glass substrates, such as liquid crystal display devices, EL display devices or density image sensors.

Example 2

This example will be explained using FIG. 8 for fabrication of a ground layer of a different form for the TFT fabricated in Example 1. The TFT cross-sectional structure shown in FIG. 8 is formed by the fabrication procedure of Example 1, and the differences with respect to Example 1 will be explained here.

Figure 8A:
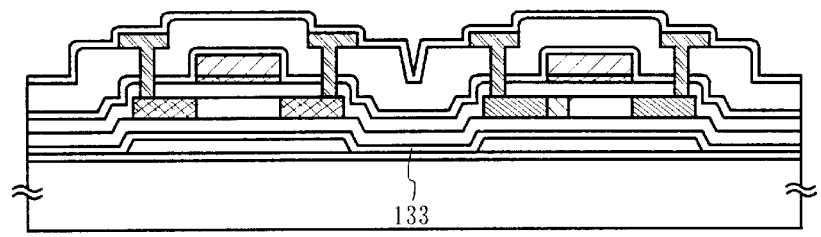
FIGS. 8A–D are cross-sectional views of the construction of a ground layer.

In FIG. 8(A), an insulating layer 133 made of a silicon oxynitride film fabricated by plasma CVD from SiH$_4$, N$_2$O and NH$_3$ is provided on the thermal conductive layer 102 and selectively formed first insulating layer 103, 104. This silicon oxynitride film is a silicon oxynitride film with an oxygen concentration of from 20 atomic % to 30 atomic % and a nitrogen concentration of from 20 atomic % to 30 atomic %, so that it is formed with almost equivalent oxygen and nitrogen contents. As a result, the internal stress is reduced below that of a silicon nitride film, and the blocking property of the alkali mete element can be provided. A second insulating layer 511 is further formed thereover. The first insulating layer 103, 104 has a thickness of 50–500 nm, while the insulating layer 133 is formed to a thickness of 50–200 nm. The third insulating layer has the effect of alleviating stress, and as a result exhibits an effect of inhibiting variation in the threshold voltage and S value of the TFT.

Figure 8B:
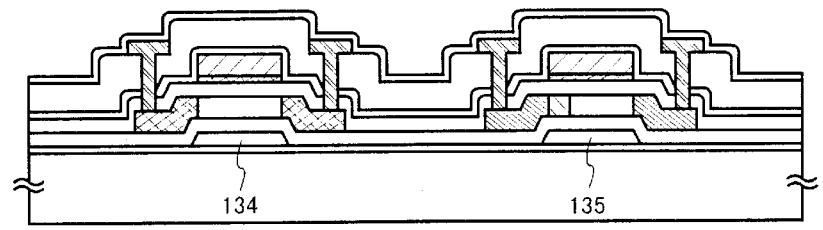

FIG. 8(B) shows a relatively smaller size for the first insulating layer 134, 135 compared to the insular semiconductor layer 107, 108. The crystal grains of the first insulting layer are large-sized, and if the channel-forming regions 152, 155 are situated in those sections, it is possible to eliminate the crystal grain boundaries in the channel-forming regions.

Figure 8C:
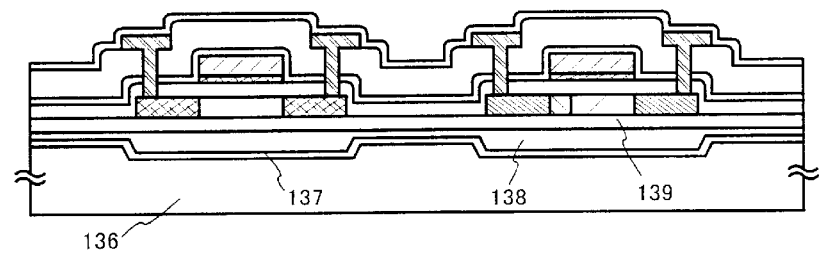

In FIG. 8(C), a trench is formed on the surface of the glass substrate 136 on which the TFT is to be formed. The trench depth is 50–500 nm, and this trench working can be easily accomplished by forming a photoresist mask with a desired pattern on the glass substrate surface and etching with an aqueous solution containing hydrogen fluoride (HF). A thermal conductive layer is formed on the surface on which the trench has been formed. The thickness of the thermal conductive layer 137 is 50–500 nm. A first insulating layer is formed thereover to a thickness of 500–2000 nm. Next, CMP (Chemical-Mechanical Polishing) is used to flatten the surface. For example, the thermal conductive layer 137 is formed to a thickness of 100 nm on the surface on which the trench has been formed to a depth of 200 nm. CMP is then used for flattening, whereby the thickness of the first insulating layer 138 may be adjusted to 500 nm at the sections where the trench is formed, and 300 nm at the sections where the trench is not formed. The polishing agent used for CMP on the silicon oxynitride film used for the second insulating film may be, for example, a dispersion of fumed silica particles, obtained by heat decomposition of silicon chloride gas, in a KOH-added aqueous solution. A TFT is thus fabricated in the same manner as Example 1 on the flattened surface.

Figure 8D:
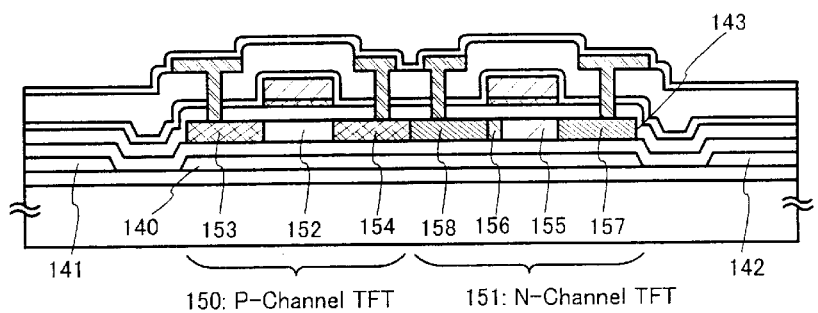

FIG. 8(D) shows a case where an n-channel type TFT 151 and p-channel type TFT 150 are formed on one insular semiconductor layer 143 formed on a first insulating layer 140. The steps for fabrication of the TFTs are the same, and by changing the layout pattern of the photomask used, it is possible to complete the structure shown in FIG. 8(D). As in FIG. 6(D) for Example 1, the p-channel type TFT 150 has a channel-forming region 152, a source region 153 and a drain region 154. The n-channel type TFT 151 has a channel-forming region 155, an LDD region 156 overlapping the gate electrode 157, a source region 157 and a drain region 158. FIGS. 6 to 8 show cases where each TFT has a single gate structure, but the structure of the gate electrode may also be a double-gate structure and there is also no problem with a multigate structure comprising multiple gate electrodes. By proximally positioning the two TFTs in this manner, it is possible to reduce fluctuations in the TFT characteristics and improve the degree of integration.

Example 3

This example illustrates a fabrication step for a CMOS circuit comprising an n-channel type TFT and p-channel type TFT with a different structure than Example 1, with reference to FIGS. 27 and 28. The order of steps and the permissible ranges for the fabrication conditions are the same as in Example 1.

Figure 27A:
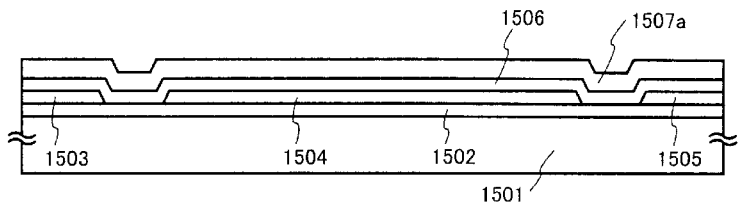
FIGS. 27A–F are cross-sectional views of fabrication steps for a TFT.

As shown in FIG. 27(A), a first insulating film 1502, a second insulating film 1503–1505 and a third insulating film are formed on a glass substrate 1501, in the same manner as Example 1. There are no restrictions on the size of the pattern-formed second insulating film, and the size of the second insulating film 1504 may be 50 $\mu$m×70 $\mu$m for formation of the insular semiconductor layer of 45 $\mu$m×65 $\mu$m (channel length direction length×channel width direction length) in a later step. An amorphous silicon film 1507 a is formed thereover.

Figure 27B:
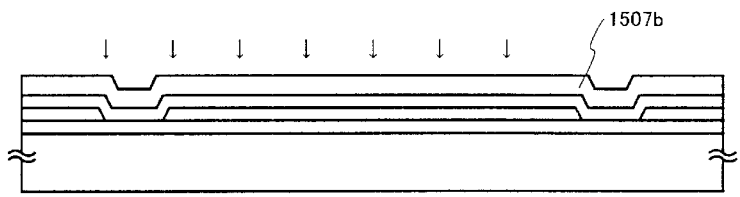

Next, as shown in FIG. 27(B), a crystalline silicon film 1507b is formed using the laser annealing explained for Embodiment 1. While the crystal grains grow to a size of a few $\mu$m on the second insulating film, they do not necessarily need to be single crystal grains, and multiple crystal grains may also be present.

Figure 27C:
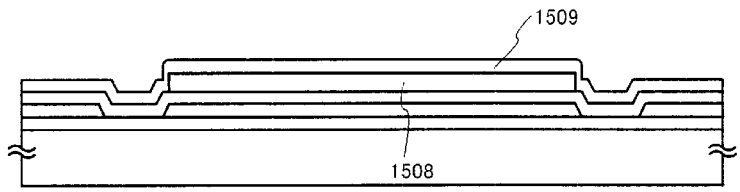

Also, as shown in FIG. 27(C), a 45 $\mu$m×65 $\mu$m insular semiconductor layer 1508 is formed on the second insulating film 1504 via a third insulating film 1506. A mask layer 1509 is also formed. The steps shown from FIG. 6(D) to FIG. 7(F) illustrate the steps for formation of a CMOS circuit by formation of an n-channel type TFT and p-channel type TFT with the insular semiconductor layer 1508 as the active layer.

Figure 27D:
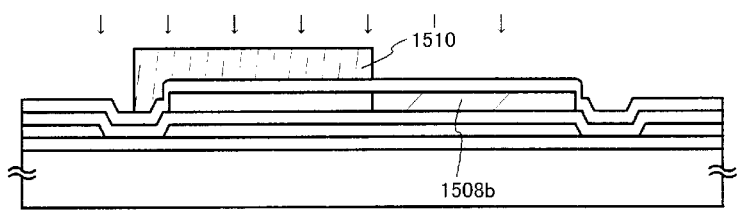
Figure 27E:
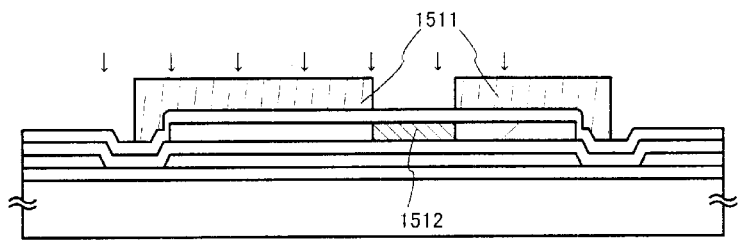
Figure 27F:
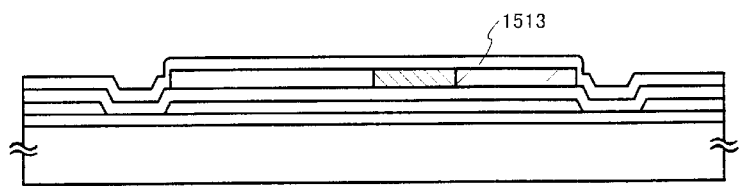

FIG. 27(D) is a channel doping step, wherein a resist mask 1510 is provided and boron (B) is added by ion-doping in the region in which the n-channel type TFT is to be formed. In FIG. 27(E), a resist mask 1511 is provided to form an n-type impurity region 1512 to serve as the LDD region of the n-channel type TFT. Also, as shown in FIG. 27(F), the mask layer 1509 is removed for laser activation treatment, to form a gate insulating film 1513.

Figure 28A:
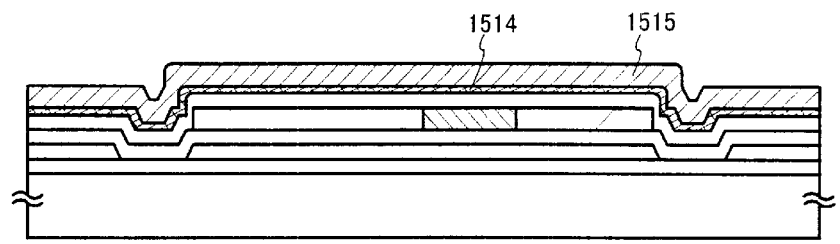
FIGS. 28A–F are cross-sectional views of fabrication steps for a TFT.
Figure 28B:
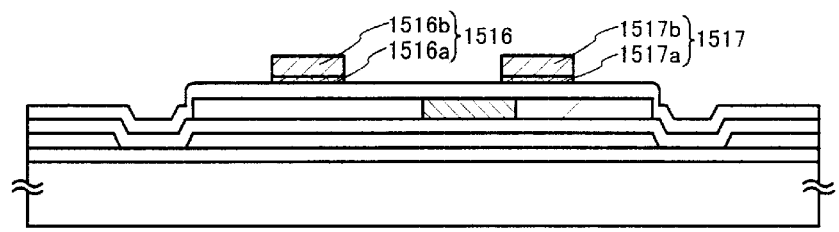

In FIG. 28(A), a conductive layer (A) 1514 and conductive layer (B) 1515 are formed on the gate insulating film by sputtering. The preferred combination for these conductive layers is a combination of TaN as the conductive layer (A) and Ta as the conductive layer (B), or a combination of WN as the conductive layer (A) and W as the conductive layer (B). Also, gate electrodes 1516, 1517 are formed, as shown in FIG. 28(B). The gate electrodes 1516, 1517 are composed of 1516 a, 1517 a made of conductive layer (A) and 1516b, 1517b made of conductive layer (B).

Figure 28C:
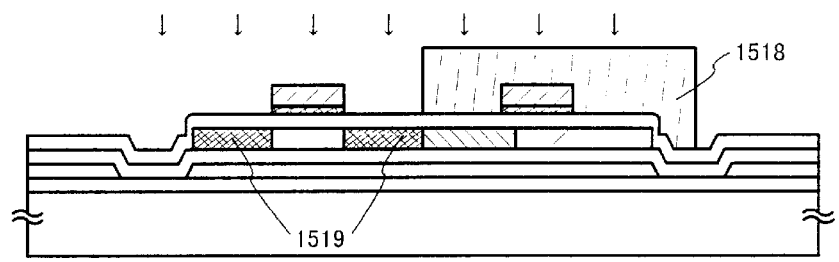
Figure 28D:
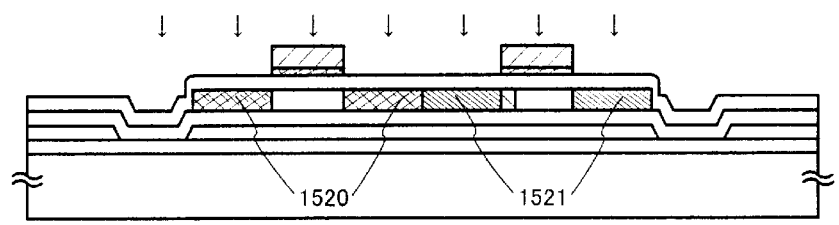

These gate electrodes are used as masks for auto-aligned formation of a source region and drain region by addition of an impurity element by ion doping. FIG. 28(C) is a step of forming a source region and drain region of a p-channel type TFT, where a p-type impurity element is added by ion doping to form a p+ impurity region 1519. Here, the region in which the n-channel type TFT is to be formed is covered with a resist mask 1518. FIG. 28(D) is a step of forming an n-channel type TFT source region and drain region, where an n-type impurity element is added by ion doping to form an n+ impurity region 1521. Phosphorus (P) is also simultaneously added to the impurity region 1519, but the since the concentration of phosphorus (P) added to the impurity region 1520 is about ½ to ⅓ of the boron (B) concentration already added in the previous step, the p-type conductivity is guaranteed so that there is no effect on the properties of the TFT.

Figure 28E:
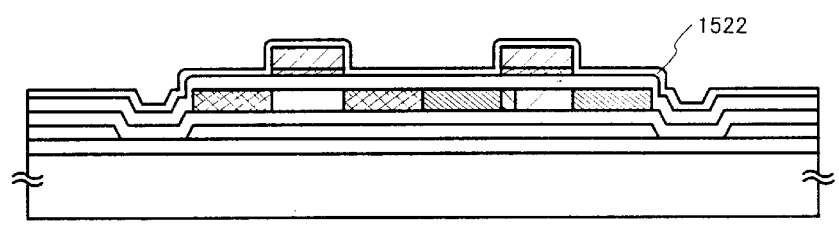
Figure 28F:
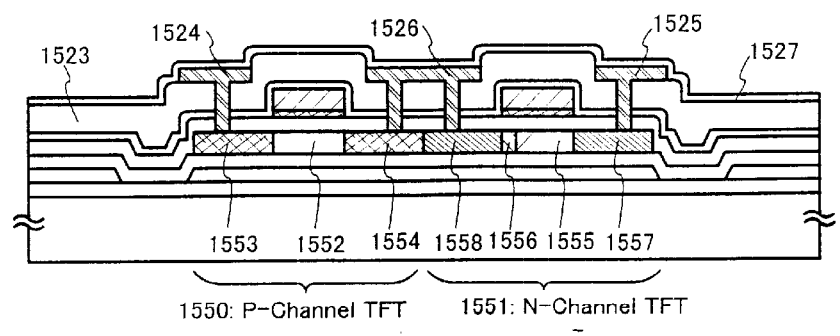

Next, a protective insulating layer 1522 is formed as shown in FIG. 28(E), and an activation step and hydrogenation step are carried out. After the steps of activation and hydrogenation have been completed, an interlayer insulating film 1523 is formed by laminating a silicon oxynitride film or silicon oxide film on the protective insulating film. Contact holes are then formed reaching to the TFT source region or drain region of the interlayer insulating film 1523 and protective insulating film 1522, forming source wirings 1524, 1525 and a drain wiring 1526. Next, a silicon nitride film or silicon oxynitride film is formed to a thickness of 50–500 nm (typically 100–300 nm) as a passivation film 1527. Hydrogenation treatment in this state can provide desirable results for improved TFT characteristics.

It is thereby possible to complete an n-channel type TFT 1551 and p-channel type TFT 1550 on the substrate 1501. The p-channel type TFT 1550 has a channel-forming region 1552, a source region 1553 and a drain region 1554. The n-channel type TFT 1551 has a channel-forming region 1555, an LDD region 1556 overlapping the gate electrode 1517, a source region 1557 and a drain region 1558. FIG. 28 shows a case where each TFT has a single gate structure, but it may also be a double-gate structure and there is also no problem with a multigate structure comprising multiple gate electrodes.

It is thus possible to form an insular semiconductor layer 1508 on one insularly formed second insulating layer 1504, and to form two TFTs using the insular semiconductor layer 1508. The two TFTs can thus be proximally situated to allow reduced TFT characteristic variation and improved integration.

Example 4

FIGS. 9 to 13 will now be used to explain the details of the steps of a process whereby a pixel TFT in a display area and a driving circuit TFT formed around the display area, are fabricated on the same substrate. To simplify the explanation, however, the control circuit will be illustrated with a shift register circuit, a CMOS circuit as the basic circuit, such as a buffer circuit, and an n-channel type TFT forming a sampling circuit.

For FIG. 9(A), a barium borosilicate glass substrate or almuminoborosilicate glass substrate may be used as the substrate 201. In this embodiment, an aluminoborosilicate glass substrate was used. On the surface of the substrate 201 on which the TFT is to be formed, there is formed a thermal conductive layer 202 of aluminum nitride (AlN) to a thickness of 50 nm. An insularly worked first insulating layer 203–206 made of silicon oxynitride is formed thereover to a thickness of 200 nm. A second insulating layer 207 made of silicon oxynitride is then formed thereover to a thickness of 100 nm. Thus, a thermal conductive layer 202, first insulating layer 203–206 and second insulating layer 207 are laminated as the ground layer.

Next, a semiconductor layer 208a having an amorphous structure with a thickness of 25–80 nm (preferably 30–60 nm) is formed by a publicly known method such as plasma CVD or sputtering. In this example, an amorphous silicon film was formed to a thickness of 55 nm by plasma CVD. Semiconductor films with amorphous structures include amorphous semiconductor films and fine crystalline semiconductor films, and a compound semiconductor film with an amorphous structure, such as an amorphous silicon-germanium film, may also be used. Since the second insulating film 207 and the amorphous silicon film 208a can be formed by the same film forming method, they both may be made by continuous formation. After forming the second insulating film, contamination of the surface can be prevented by once removing it from the air atmosphere, thus reducing fluctuation of the characteristics and variation in the threshold voltage of the fabricated TFT.

Figure 21:
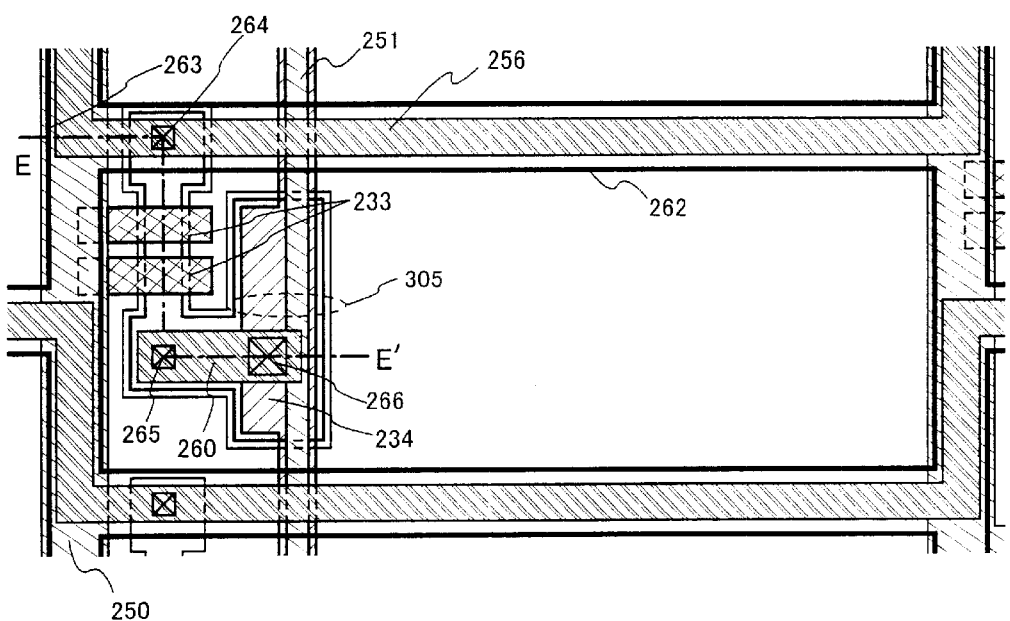
FIG. 21 is a top view showing a pixel in a pixel section.

A crystalline silicon film 208b is then formed from the amorphous silicon film 208a. This is accomplished by the laser annealing method of the invention, as explained for Embodiment 1. Alternatively, heat annealing and laser annealing may be combined by the technique disclosed in Japanese Laid-Open Patent Publication No. 130652 of 1995 mentioned for Embodiment 3, to form a crystalline silicon film 208b. When laser annealing is used, a laser annealing apparatus such as shown in FIG. 21, with an XeCl excimer laser (wavelength: 308 nm) as the laser light emitting device, is used to form a linear beam with an optical system, and irradiation is performed with an oscillation frequency of 5–50 Hz, an energy density of 100–500 mJ/cm$^2$ and a linear beam overlap of 80–98%. A crystalline silicon film 208b is thereby obtained (FIG. 9(B)).

The crystalline silicon film 208b is then subjected to etching treatment for division into islands, to form an insular semiconductor layer 209, 210a–212a as the active layer. Next, a mask layer 213 is formed by a silicon oxide film with a thickness of 50–100 nm by plasma CVD, reduced pressure CVD or sputtering. By reduced pressure CVD, for example, a mixed gas of $SiH_4$ and $O_2$ is used to form a silicon oxide film with heating at 400° C. under 266 Pa (FIG. 9(C)).

For the channel doping step, a photoresist mask 214 is provided and boron (B) is added as a p-type impurity element to a concentration of about $1\times10^{16}$ to $5\times10^{17}$ atoms/cm$^3$ for the purpose of controlling the threshold voltage over the entire surface of the insular semiconductor layer 210a–212a on which the n-channel type TFT is to be formed. The addition of boron (B) may be accomplished by ion doping, and it may also be simultaneously added with formation of the amorphous silicon film. The boron (B) addition is not always necessary, but it was found to be preferable to form a semiconductor layer 210b–212b containing boron (B) to limit the threshold voltage of the n-channel type TFT to within the prescribed range.

For formation of the n-channel type TFT LDD region of the driving circuit, an n-type impurity element is selectively added to the insular semiconductor layer 210b, 211b. A photoresist mask 215–218 is formed beforehand. In this case ion doping was applied using phosphine ($PH_3$) in order to add phosphorus (P). The phosphorus (P) concentration of the formed impurity region (n$^-$) 219, 220 is in the range of $1\times10^{17}$ to $5\times10^{19}$ atoms/cm$^3$ (FIG. 10(A)). The impurity region 221 is a semiconductor layer for formation of the holding capacitance of the display area, and phosphorus (P) is added to the same concentration in this region as well.

This is followed by a step of removing the mask layer 213 with hydrofluoric acid or the like to activate the impurity element added in FIG. 9(D) and FIG. 10(A). The activation may be carried out by a method such as heat annealing for 1–4 hours at 500–600° C. in a nitrogen atmosphere, or by a different method such as laser annealing. Both methods may also be used in combination. In this example, a laser activating method was used, with a KrF excimer laser (wavelength: 248 nm) employed to form a linear beam at an oscillation frequency of 5–50 Hz, an energy density of 100–500 mJ/cm$^2$ and scanning with a linear beam overlap of 80–98%, for treatment of the entire surface of the substrate on which the insular semiconductor layer had been formed. There are no particular restrictions on the laser light irradiation conditions, and they may be appropriately determined by the operator.

A gate insulating film 222 is formed of an insulating film containing silicon to a film thickness of 40–150 nm using plasma CVD or sputtering. For example, it may be formed with a silicon oxynitride film fabricated by plasma CVD with, for example, $SiH_4$, $N_2O$ and $O_2$ as the starting materials.

A first conductive layer is then formed to make the gate electrode. In this example, conductive layer (A) 223 made of a conductive metal nitride film was laminated with a conductive layer (B) 224 made of a metal film. Here, the conductive layer (B) 224 was formed to a thickness of 250 nm with tantalum (Ta) by sputtering with Ta as the target, and the conductive layer (A) 223 was formed to a thickness of 50 nm with tantalum nitride (TaN) (FIG. 10(C)).

Next, a photoresist mask 225–229 is formed, and the conductive layer (A) 223 and conductive layer (B) 224 are etched together to form gate electrodes 230–233 and capacity wiring 234. The gate electrodes 230–233 and capacity wiring 234 are formed by integration of 230a–234a made of the conductive layer (A) and 230b–234b made of the conductive layer (B). Here, the gate electrodes 231, 232 formed in the driving circuit are formed to overlap with a portion of the impurity regions 219, 220 via the gate insulating film 222. (FIG. 10(D)).

This is followed by a step of adding a p-type impurity element to form a source region and drain region for the p-channel type TFT of the driving circuit. Here, the gate electrode 230 is used as a mask to form a self-aligning impurity region. The region in which the n-channel type TFT is to be formed is covered with a photoresist mask 235. The impurity region (p+) 234 was formed by an ion doping method using diborane ($B_2H_6$), to a concentration of $1\times10^{21}$ atoms/cm$^3$ (FIG. 11(A)).

Next, an impurity region to function as a source region or drain region was formed in n-channel type TFT. A resist mask 237–239 was formed, and an n-type impurity element was added to form impurity regions 241–244. This was accomplished by an ion doping method using phosphine ($PH_3$), and the phosphorus (P) concentration in the impurity regions (n$^+$) 241–244 was $5\times10^{20}$ atoms/cm$^3$ (FIG. 11(B)). Boron (B) is already included in the impurity region 240 due to addition in the previous step, but since phosphorus (P) is added to about ½ to ⅓, the influence of the phosphorus (P) may be ignored, and there is no effect on the properties of the TFT.

For formation of the n-channel type TFT LDD region of the display area, a step of adding an n-type impurity element was carried out. Here, the gate electrode 233 was used as a mask for self-aligning addition of an n-type impurity element by ion doping. The concentration of the added phosphorus (P) was $5\times10^{16}$ atoms/cm$^3$, and since the addition is to a lower concentration than the concentration of the impurity element added in FIG. 9(A) and FIGS. 10(A) and (B), substantially only impurity regions (n$^-$) 245, 246 are formed (FIG. 11(C)).

This was followed by a step of heat annealing for activation of the n-type or p-type impurity element added in to their respective concentrations. This step can be accomplished by heat annealing using a furnace annealer, or by laser annealing or rapid thermal annealing (RTA). Here, the activation step was carried out by furnace annealing. The heat treatment is generally accomplished in a nitrogen atmosphere with an oxygen concentration of no greater than 1 ppm, at 400–700° C. and typically 500–600° C., and for this example, heat treatment was carried out at 550° C. for 4 hours.

In this heat annealing, the Ta film 230b–234b for formation of the gate electrodes 230–233 and capacity wiring 234 is formed as a conductive layer (C) 230c–234c comprising TaN to a thickness of 5–80 nm from the surface. When the conductive layer (B) 230b–234b, tungsten nitride (WN) may be formed, and when it is titanium (Ti), titanium nitride (TiN) may be formed. It may be formed in the same manner even when the gate electrodes 230–234 are exposed to a plasma atmosphere containing nitrogen, using nitrogen or ammonia. There was also performed a step of heat annealing for 1–12 hours at 300–450° C. in an atmosphere containing 3–100% hydrogen, for hydrogenation of the insular semiconductor layer. This step is a step for terminating the $10^{16}$–$10^{18}$ cm$^3$ dangling bond of the insular semiconductor layer by thermally excited hydrogen. Plasma hydrogenation (using plasma-excited hydrogen) may also be carried out as another means for hydrogenation.

When a catalyst element that aids crystallization of silicon is used in the crystallization step and no subsequent gettering step is carried out as explained for Embodiment 3, a trace amount of the catalyst element remains in the insular semiconductor layer (about $1\times10^{17}$–$1\times10^{19}$ atoms/cm$^3$). While the TFT can of course still be completed even in that state, it was found preferable to at least remove the residual catalyst element from the channel-forming region. One means of removing the catalyst element was a technique utilizing the gettering effect of phosphorus (P). The phosphorus (P) concentration required for gettering is sufficient if it is roughly equivalent to that of the impurity region (n$^+$) formed in FIG. 10(B), and the heat annealing of the activation step carried out here allowed segregation of the catalyst element from the channel-forming regions of the n-channel type TFT and p-channel type TFT into the impurity regions 240–244, for gettering. As a result, the catalyst element was segregated at about $1\times10^{17}$–$1\times10^{19}$ atoms/cm$^3$ in the impurity regions 240–244 (FIG. 11(D)).

Figure 14A:
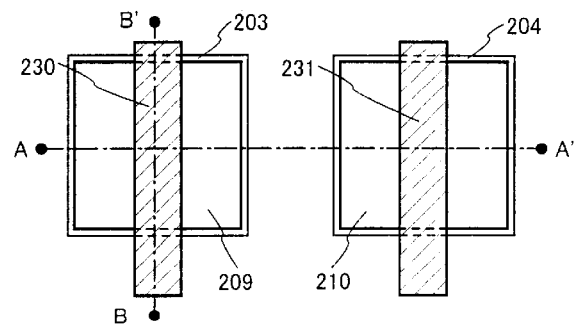
FIGS. 14A–C are top views of fabrication steps for a driving circuit TFT.
Figure 14B:
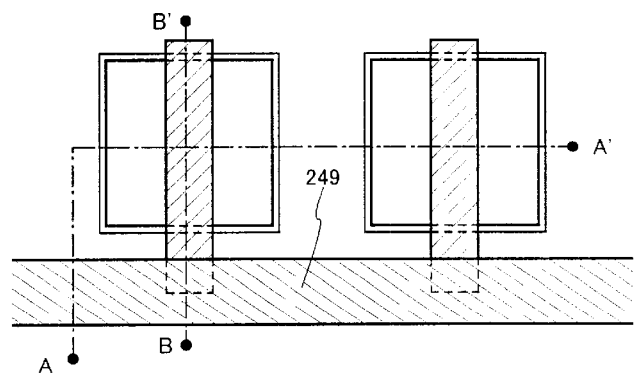
Figure 14C:
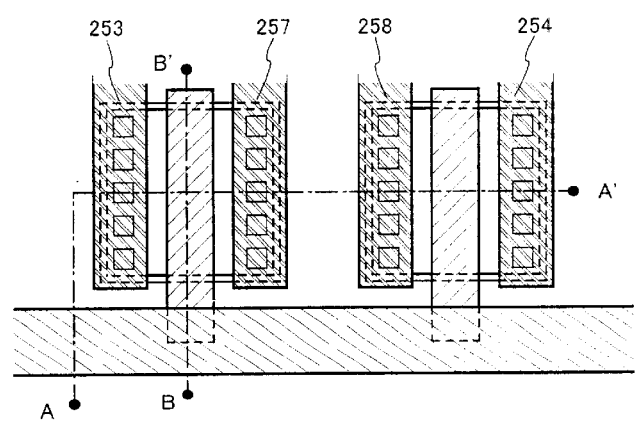
Figure 15A:
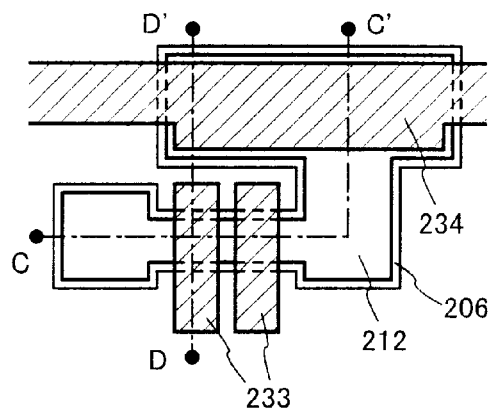
FIGS. 15A–C are top views is a top view of fabrication steps for a pixel TFT.
Figure 16A:
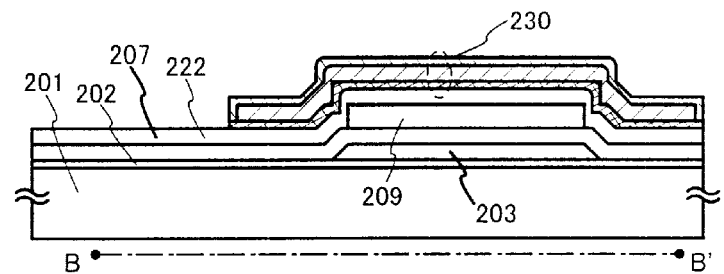
FIGS. 16A–C are cross-sectional views of fabrication steps for a driving circuit TFT.
Figure 17A:
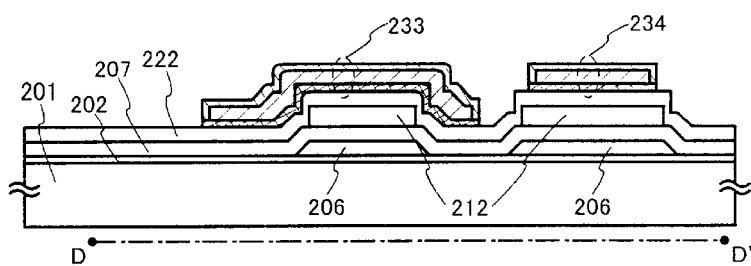
FIGS. 17A–C are top views of fabrication steps for a pixel TFT.

FIG. 14(A) and FIG. 15(A) are top views of the TFT of FIG. 11(D), where cross-section A–A' and cross-section C–C' correspond to A-A' and C-C' in FIG. 11(D). Cross-section B–B' and cross-section D–D' correspond to the cross-sectional views of FIG. 16(A) and FIG. 17(A). The top views of FIG. 14 and FIG. 15 omit the gate insulating films, but up to this step, the gate electrodes 230, 231, 233 and capacity wiring 234 are formed on the insular semiconductor layers 209, 210, 212 formed on the second insulating layer 203, 204, 206, as shown.

After completion of the steps of activation and hydrogenation, the second conductive layer to serve as the gate wiring is formed. This second conductive layer is formed with a conductive layer (D) composed mainly of aluminum (Al) or copper (Cu) as low resistance materials. In either case, the resistivity of the second conductive layer is about 0.1–10 $\mu\Omega$cm. A conductive layer (E) made of titanium (Ti), tantalum (Ta), tungsten (W) or molybdenum (Mo) may also be formed by lamination. In this example, the conductive layer (D) 247 was an aluminum (Al) film containing 0.1–2 wt % titanium (Ti), and the conductive layer (E) 248 was a titanium (Ti) film. The conductive layer (D) 247 may be formed to 200–400 nm (preferably 250–350 nm), and the conductive layer (E) 248 may be formed to 50–200 nm (preferably 100–150 nm) (FIG. 12(A)).

The conductive layer (E) 248 and conductive layer (D) 247 were subjected to etching treatment to form the gate wiring connecting the gate electrodes, thus forming gate wirings 249, 250 and capacity wiring 251. The etching treatment first accomplished removal from the surface of the conductive layer (E) to partway through the conductive layer (D) by a dry etching method using a mixed gas of $SiCl_4$, $Cl_2$ and $BCl_3$, and then wet etching was performed with a phosphoric acid-based etching solution to remove the conductive layer (D), thus allowing formation of a gate wiring while maintaining selective working with the ground layer.

Figure 12A:
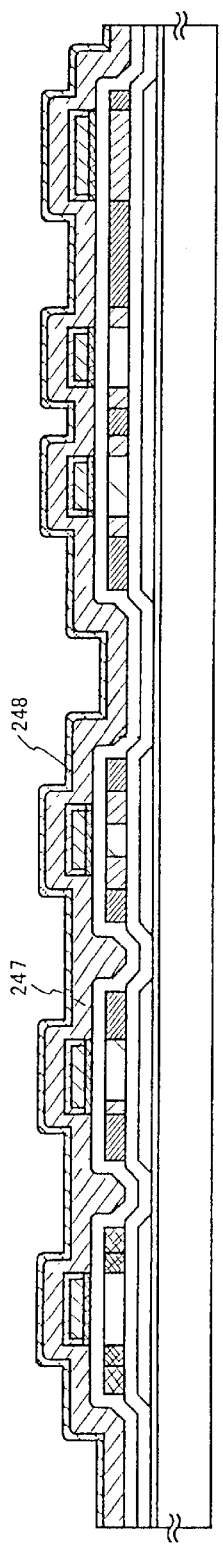
FIGS. 12A–C are cross-sectional views of fabrication steps for a pixel TFT and driving circuit TFT.
Figure 12B:
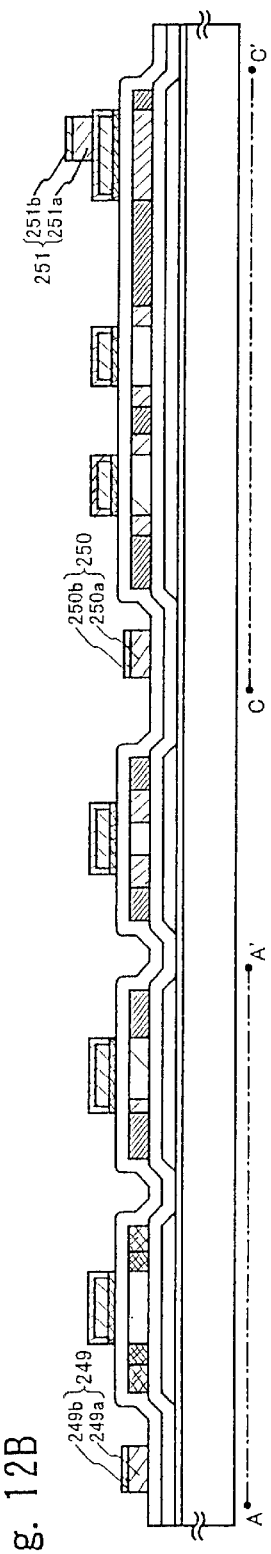
Figure 15B:
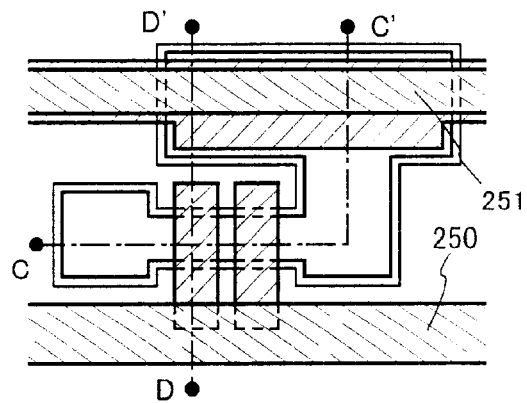
Figure 16B:
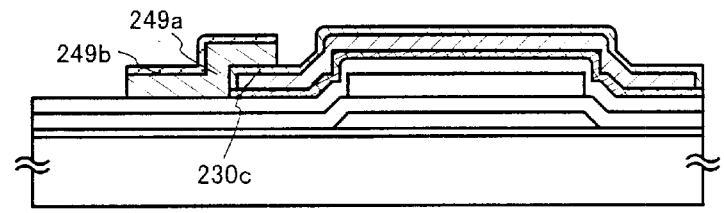
Figure 17B:
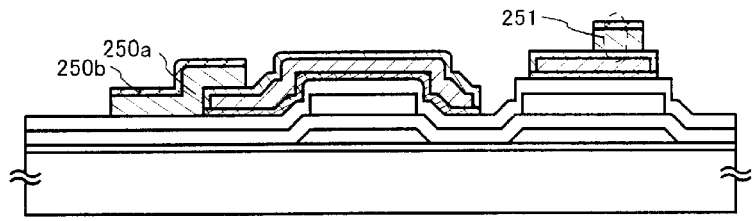

FIG. 14(B) and FIG. 15(B) are top views of this state, where cross-section A–A' and cross-section C–C' correspond to A–A' and C–C' in FIG. 12(B). Cross-section B–B' and cross-section D–D' correspond to the B–B' and D–D' in FIG. 16(B) and FIG. 17(B). In FIG. 14(B) and FIG. 15(B), part of the gate wirings 249, 250 overlap and are in electrical contact with part of the gate electrodes 230, 231, 233. This condition is clearly shown in the cross-sectional structural diagrams of FIG. 16(B) and FIG. 17(B) corresponding to cross-section B–B' and cross-section D–D', where conductive layer (C) forming the first conductive layer and conductive layer (D) forming the second conductive layer are in electrical contact.

A first interlayer insulating film 252 is formed with a silicon oxide film or silicon oxynitride film to a thickness of 500–1500 nm. In this example, it was formed with $SiH_4$ at 27 SCCM, $N_2O$ at 900 SCCM, a reaction pressure of 160 Pa, a substrate temperature of 325° C. and a discharge current density of 0.15 W/cm². Next, contact holes are formed reaching to the source region or drain region formed in each insular semiconductor layer, to form source wirings 253–256 and drain wirings 257–260. While not shown here, in this example the electrode has a three-layer laminated structure with continuous formation of a Ti film to 100 nm, a Ti-containing aluminum film to 300 nm and a Ti film to 150 nm by sputtering.

Next, a silicon nitride film, silicon oxide film or a silicon oxynitride film is formed to a thickness of 50–500 nm (typically 100–300 nm) as a passivation film 261. Hydrogenation treatment in this state gave favorable results for enhancement of the TFT characteristics. For example, heat treatment may be carried out for 1–12 hours at 300–450° C. in an atmosphere containing 3–100% hydrogen, or a similar effect may be achieved by using a plasma hydrogenation method. Such heat treatment can accomplish hydrogenation by diffusion of the hydrogen present in the first interlayer insulating film 252 into the insular semiconductor layer 209, 210b–212b. In any case, it is preferred to reduce the defect density of the insular semiconductor layer 107, 108b to under $10^{16}/cm^3$, and it was found that inclusion of hydrogen to 0.01–0.1 atomic % was satisfactory for this purpose (FIG. 12(C)). Here, an opening may be formed in the passivation film 261 at the position where the contact holes are to be formed for connection of the pixel electrodes and the drain wirings.

Figure 12C:
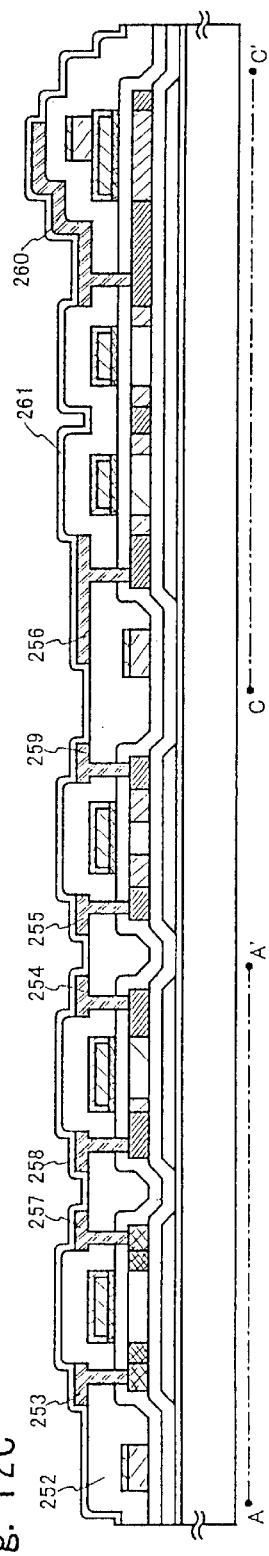
Figure 15C:
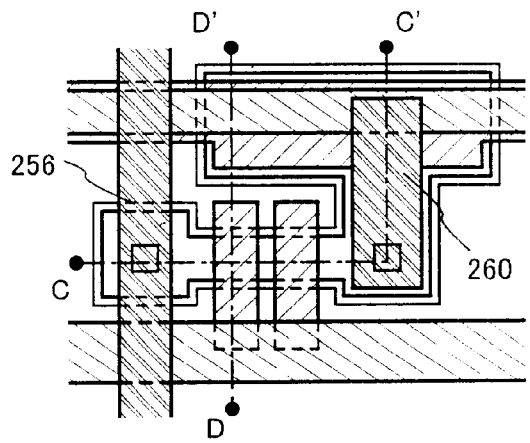
Figure 16C:
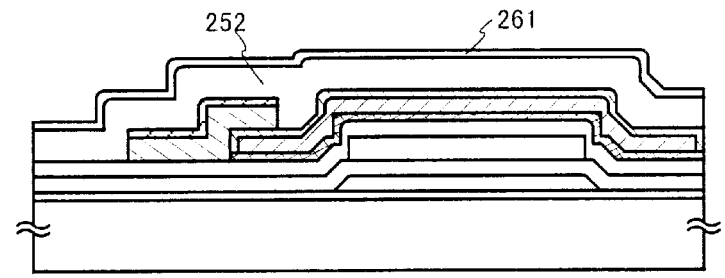
Figure 17C:
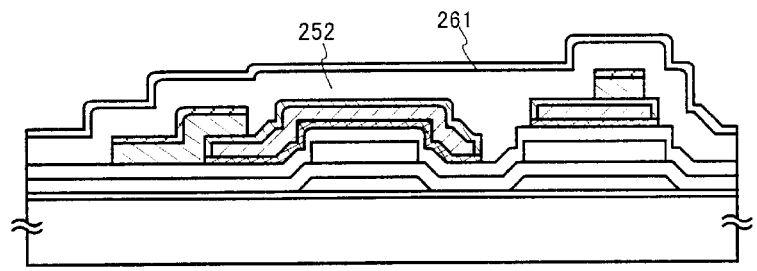

FIG. 14(C) and FIG. 15(C) show top views of this condition, where cross-section A–A' and cross-section C–C' correspond to A–A' and C–C' in FIG. 12(C). Cross-section B–B' and cross-section D–D' correspond to B–B' and D–D' in FIG. 16(C) and FIG. 17(C). FIG. 14(C) and FIG. 15(C) do not show the first interlayer insulating film, but the source wirings 253, 254, 256 and drain wirings 257, 258, 260 in the source and drain regions (not shown) of the insular semiconductor layer 209, 210, 212 are connected via contact holes formed in the first interlayer insulating film.

Figure 13:
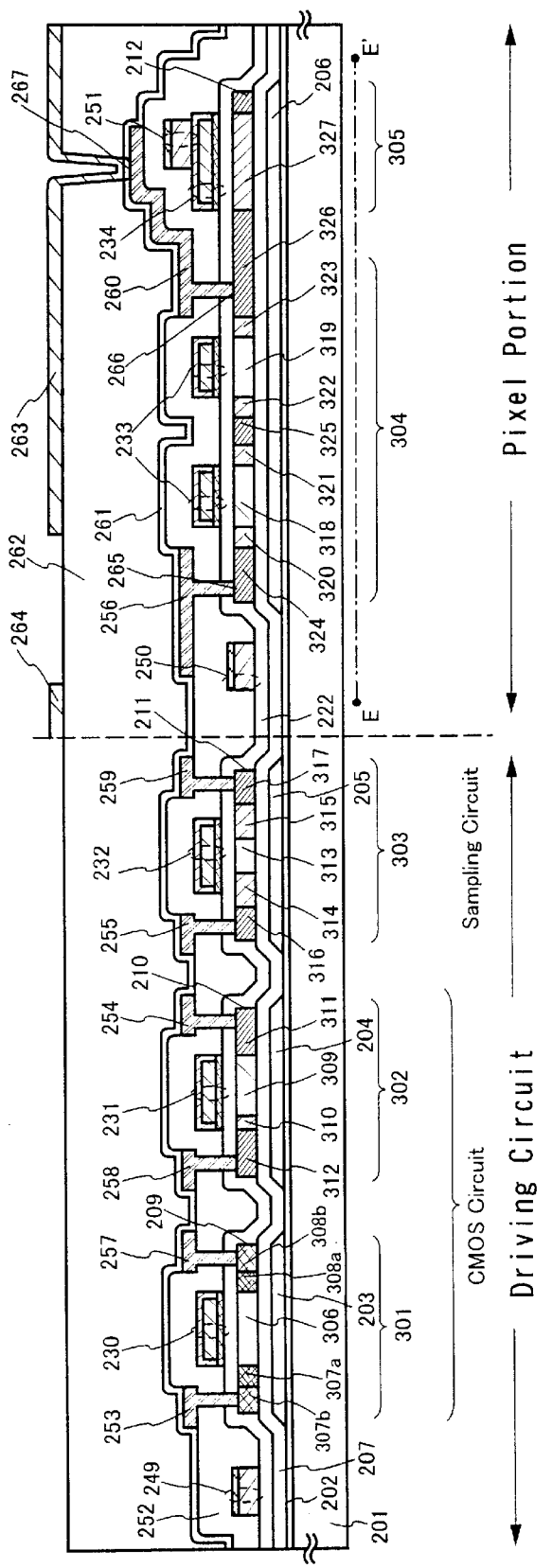
FIG. 13 is a cross-sectional view of a pixel TFT and a driving circuit TFT.

Next, a second interlayer insulating film 262 made of an organic resin is formed to a thickness of 1.0–1.5 μm. The organic resin used may be polyimide, acryl, polyamide, polyimide amide, BCB (benzocyclobutene) or the like. Here, after coating onto the substrate, a thermal polymerization type polyimide was used for formation by firing at 300° C. A contact hole reaching to the drain wiring 260 is then formed in the second interlayer insulating film 262, and pixel electrodes 263, 264 are formed. The pixel electrodes used may be of a transparent conductive film in the case of a transmitting liquid crystal display device, or of a metal film in the case of a reflective liquid crystal display device. In this example a transmitting liquid crystal display device was used, and therefore an indium-tin oxide (ITO) film was formed by sputtering to a thickness of 100 nm (FIG. 13).

A substrate with a driving circuit TFT and a display area image TFT on the same substrate was completed in this manner. A p-channel type TFT 301, a first n-channel type TFT 302 and a second n-channel type TFT 303 were formed on the driving circuit and a pixel TFT 304 and a holding capacity 305 were formed on the display area. Throughout the present specification, this substrate will be referred to as an active matrix substrate for convenience.

The p-channel type TFT 301 of the driving circuit has a channel-forming region 306, source regions 307a, 307b and drain regions 308a, 308b in the insular semiconductor layer 209. The first n-channel type TFT 302 has a channel-forming region 309, an LDD region ($L_{ov}$) 310 overlapping the gate electrode 231, a source region 311 and a drain region 312 in the insular semiconductor layer 210. The length of this $L_{ov}$ region in the channel length direction was 0.5–3.0 μm, and is preferably 1.0–1.5 μm. The second n-channel type TFT 303 has a channel-forming region 313 and an $L_{ov}$ region and $L_{off}$ region (an LDD region not overlapping the gate electrode 130, hereunder referred to as $L_{off}$ region) formed in the insular semiconductor layer 211, and the length of this $L_{off}$ region in the channel length direction is 0.3–2.0 μm, and preferably 0.5–1.5 μm. The pixel TFT 304 has channel-forming regions 318, 319, $L_{off}$ regions 320–323 and source or drain regions 324–326 in the insular semiconductor layer 212. The length of the $L_{off}$ regions in the channel length direction is 0.5–3.0 μm, and preferably 1.5–2.5 μm. The capacity wirings 234, 251 and an insulating film made of the same material as the gate insulating film are connected to the drain region 326 of the pixel TFT 304, while a holding capacity 305 is formed from an n-type impurity element-added semiconductor layer 327. In FIG. 12 the pixel TFT 304 has a double gate structure, but it may also have a single gate structure, and there is no problem with a multigate structure provided with multiple gate electrodes.

This construction optimizes the structures of the TFTs of each circuit in accordance with the specifications required for the pixel TFT and driving circuit, thus allowing the operating performance and reliability of the semiconductor device to be improved. In addition, by forming the gate electrodes with a heat resistant conductive material, it is possible to facilitate activation of the LDD regions and source and drain regions, and thus adequately reduce wiring resistance by formation of the gate wirings with low resistance materials. This allows application to display devices having display areas (screen sizes) in the class of 4 inches and larger. In addition, by using a crystalline silicon film with a single crystal structure selectively formed on the first insulating layer 203–206 on which the ground layer is to be formed,. it is possible to realize a completed TFT as an n-channel type TFT with an S value between 0.10 V/dec and 0.30 V/dec, a $V_{th}$ between 0.5 V and 2.5 V and a field effect mobility of at least 300 cm²/V·sec. It is also possible to realize a p-channel type TFT with an S value between 0.10 V/dec and 0.30 V/dec, a $V_{th}$ between −0.5 V and −2.5 V and a field effect mobility of at least 200 cm²/V·sec.

Example 5

Figure 19:
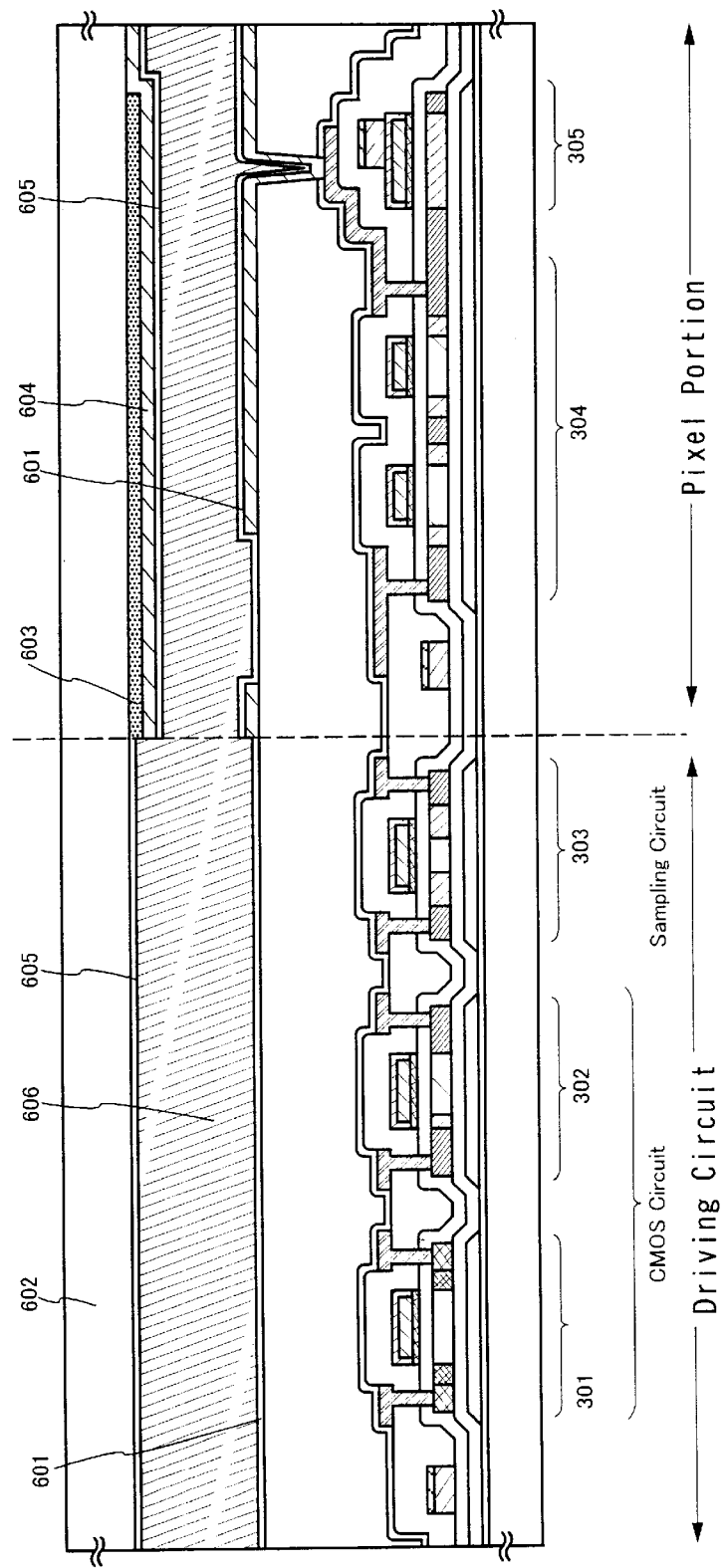
FIG. 19 is a cross-sectional view showing the structure of a liquid crystal display device.

In this example, the steps for fabricating an active matrix-type liquid crystal display device from the active matrix substrate fabricated in Example 4 will be explained. As shown in FIG. 19, an orientation film 601 is formed on an active matrix substrate in the state shown in FIG. 13. A polyimide resin is often used as the orientation film for most liquid crystal display elements. On the opposing substrate 602 on the opposite side there are formed a non-transparent film 603, a transparent conductive film 604 and an oriented film 605. After forming the oriented film, it is subjected to rubbing treatment so that the liquid crystal molecules are oriented with a consistent pretilt angle. The pixel section and the substrate opposite the active matrix substrate on which the CMOS circuit has been formed are attached together through a sealing material or spacer (neither shown) by a publicly known cell joining step. Next, a liquid crystal material 606 is injected between both substrates and complete sealing is accomplished with a sealant (not shown). The liquid crystal material used may be any publicly known liquid crystal material. This completes the active matrix-type liquid crystal display device shown in FIG. 19.

The structure of this active matrix-type liquid crystal display device will now be explained with reference to the perspective view in FIG. 20 and the top view in FIG. 21. The same numerals are used in FIGS. 20 and 21 for correspondence with the cross-sectional structural diagrams of FIGS. 9 to 13 and FIG. 19. The cross-sectional structure along E–E' in FIG. 21 corresponds to the cross-sectional diagram of the pixel matrix circuit shown in FIG. 13.

Figure 20:
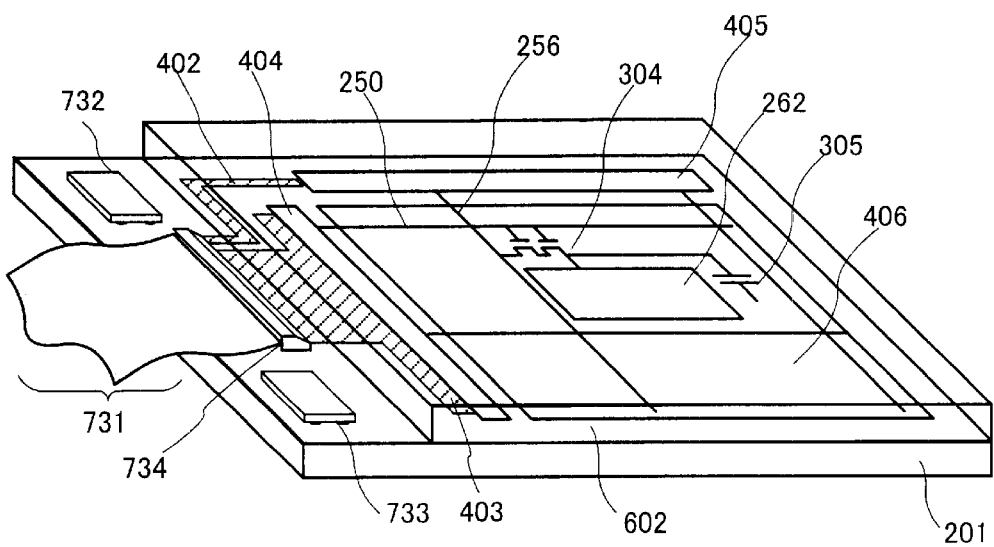
FIG. 20 is a perspective view of the structure of a liquid crystal display device.

In FIG. 20, the active matrix substrate is constructed of a pixel section 406, a scanning signal driving circuit 404 and an image signal driving circuit 405 formed on a glass substrate 201. A pixel TFT 304 is provided in the display area, and the driving circuit provided around it is constructed based on a CMOS circuit. The scanning signal driving circuit 404 and the image signal driving circuit 405 are each connected to the pixel TFT 304 with a gate wiring 250 and source wiring 256. Also, an FPC (flexible printed circuit) 731 is connected to an external I/O terminal 734 and is connected to each driving circuit with input wirings 402, 403.

FIG. 21 is a top view showing about one pixel portion of the display area 406. The gate wiring 250 crosses with the semiconductor layer 212 under it via a gate insulating film (not shown). Also not shown on the semiconductor layer are a source region, drain region and an $L_{off}$ region as an n⁻ region. A connector 256 is present between the source wiring 256 and the source region 324, a connector 266 is present between the drain wiring 260 and the drain region 326, and a connector 267 is present between the drain wiring 260 and the pixel electrode 263. A holding capacity 305 is formed in the region where the semiconductor layer 327 extending from the drain region 326 of the pixel TFT 304 overlaps with the capacity wirings 234, 251 via a gate insulating film. The active matrix-type liquid crystal display device of this embodiment was explained with the structure of Example 4, but this is not limited to the structure of Example 4, as an active matrix-type liquid crystal display device may also be completed using the construction shown in Embodiments 1–3 in application to Example 4. In any case, an active matrix substrate provided with the ground layer illustrated by Embodiment 1 can be freely combined therewith to fabricate an active matrix-type liquid crystal display device.

Example 6

Figure 18:
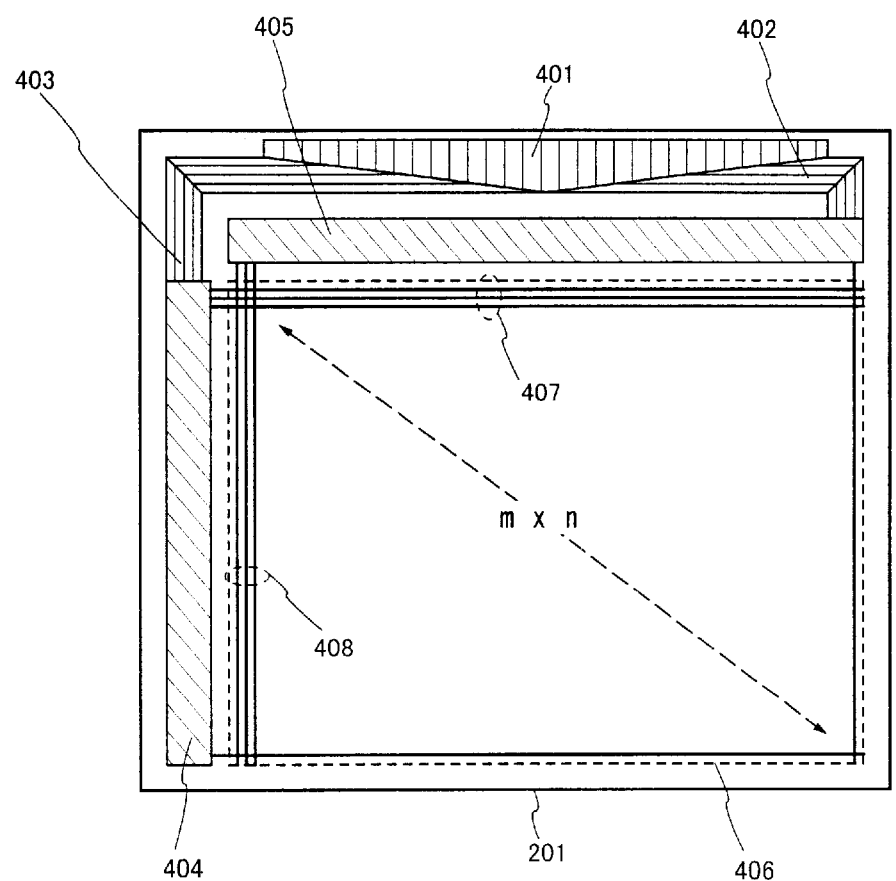
FIG. 18 is a top view showing the I/O terminal, wiring and circuit layout of a liquid crystal display device.

FIG. 18 is an illustration showing one arrangement of the I/O terminal, display area and driving circuit of a liquid crystal display device. The display area 406 has m gate wirings and n source wirings crossing in a matrix fashion. For example, when the pixel density is VGA, 480 gate wirings and 640 source wirings are formed, and for XGA 768 gate wirings and 1024 source wirings are formed. The screen size of the display area has a diagonal length of 340 mm in the case of a 13-inch class display, and 460 mm in the case of an 18-inch class display. In order to realize such a liquid crystal display device it is necessary to form the gate wirings with a low resistance material as indicated for Example 3. As the time constant for the gate wiring (resistance×volume) increases the response speed of the scanning signal is delayed, making it impossible to drive the liquid crystals at high speed. For example, if the resistivity of the material forming the gate wiring is 100 $\mu\Omega$cm the limit to the screen size will be about 6 inch class, but for 3 $\mu\Omega$cm a screen size of 27 inch class is possible.

A scanning signal driving circuit 404 and an image signal driving circuit 405 are provided around the display area 406. Since the lengths of these driving circuit gate wirings are also necessarily longer with increasing size of the screen of the display area, the gate wirings are preferably formed of a low resistance material such as aluminum (Al) or copper (Cu) as indicated for Example 4, in order to realize large-sized screens. According to the invention, the input wirings 402, 403 connecting from the input terminal 401 to each driving circuit may be formed of the same material as the gate wirings, and they can contribute to the lower wiring resistance.

On the other hand, when the screen size of the display area is a 0.9 inch class, the diagonal length is about 24 mm, and if the TFT is fabricated on a submicron rule it will be housed within 30×30 mm² including the driving circuit provided around it. In such cases, it is not always necessary to form the gate wirings of the low resistance material indicated for Example 4, and the gate wirings may instead be formed of the same material as the material used to form the gate electrodes, such as Ta or W.

A liquid crystal display device with this construction may also be completed using an active matrix substrate completed by the crystallization method explained for Embodiments 1–3 in application to Example 4. In any case, an active matrix substrate completed by the crystallization technique explained for Embodiments 1–3 can be freely combined therewith to fabricate an active matrix-type liquid crystal display device.

Example 7

Figure 24A:
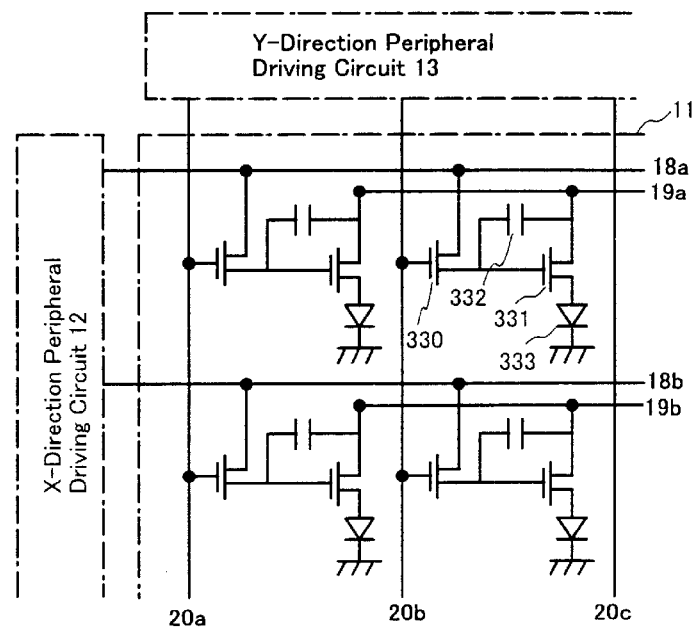
FIGS. 24A and B are pairs of illustrations showing the structure of an active matrix-type EL display device.

In this example, FIG. 24 will be used for explanation of the invention as applied to an active matrix-type organic electroluminescent (organic EL) material employed in a display device (organic EL display device). FIG. 24(A) shows a circuit diagram of an active matrix-type organic EL display device. This organic EL display device comprises a display area 11, an X-direction peripheral driving circuit 12 and a Y-direction peripheral driving circuit 13 provided on the substrate. The display area 11 is composed of a switching TFT 330, a holding capacity 332, a current controlling TFT 331, an organic EL element 333, X-direction signal lines 18a, 18b, power lines 19a, 19b, Y-direction signal lines 20a, 20b, 20c, etc.

Figure 24B:
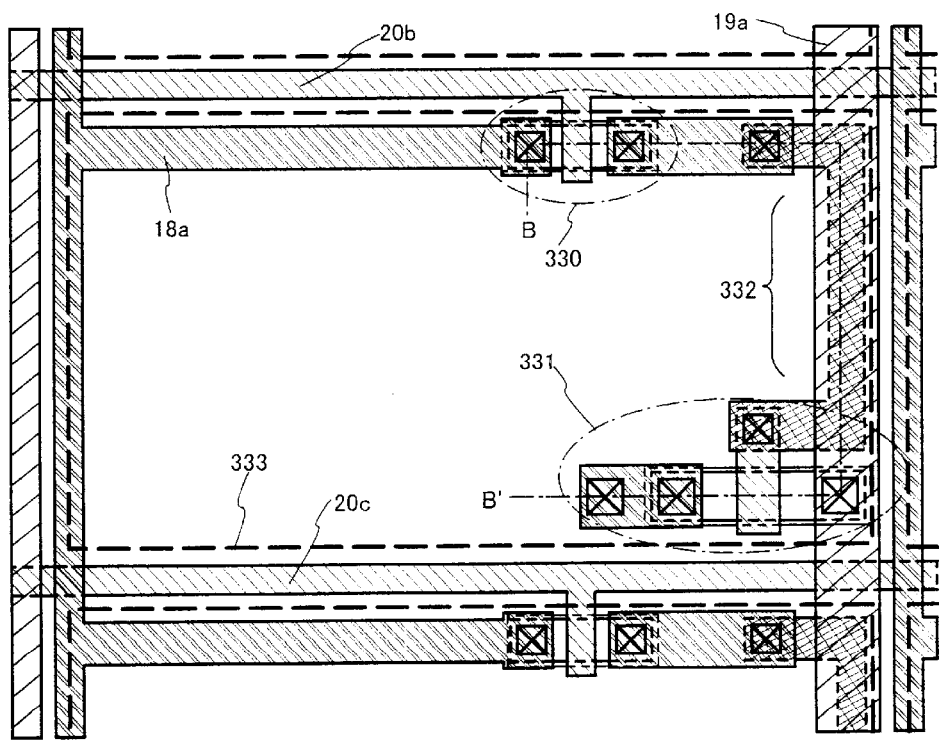

FIG. 24(B) shows a top view of approximately one pixel portion. The switching TFT 330 is formed in the same manner as the p-channel type TFT 301 shown in FIG. 13, and the current controlling TFT 331 is formed in the same manner as the n-channel type TFT 303.

Incidentally, in the case of an organic EL display apparatus in operating mode where light is emitted toward the top of the TFT, the pixel electrode is formed of a reflective electrode such as Al. The structure shown here is that of the pixel region of an organic EL display device, but it is also possible to employ a peripheral circuit-integral active matrix-type display device with the driving circuit provided around the pixel region, as in Example 1. A color filter, not shown, may also be provided for color display. In any case, the active matrix substrate provided with the ground layer illustrated by Embodiment 1 can be freely combined therewith to fabricate an active matrix-type organic EL display device.

Example 8

An active matrix substrate and liquid crystal display device or EL display device fabricated according to the present invention may be used for a variety of electro-optical devices. The invention may also be applied to any electronic instrument incorporating such an electro-optical device as a display medium. As electronic instruments there may be mentioned personal computers, digital cameras, video cameras, portable data terminals (mobile computers, cellular phones, electronic books, etc.), navigation systems, and the like. Examples of these are shown in FIG. 25.

Figure 25A:
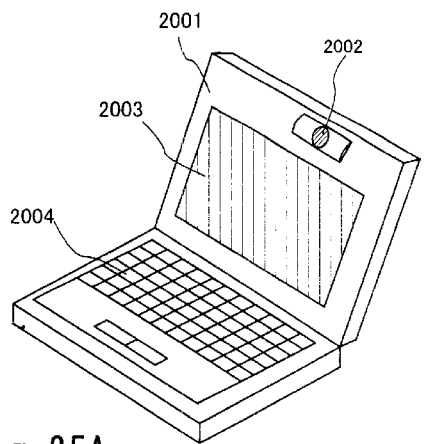
FIGS. 25A–F are sets of illustrations showing examples of semiconductor devices.

FIG. 25(A) is a personal computer, which is constructed with a main body 2001 provided with a microprocessor or memory, an image input device 2002, a display device 2003 and a keyboard 2004. A TFT fabricated using a crystalline semiconductor film fabricated by laser annealing according to the invention may be used to form the display device 2003 or the other signal processing circuits.

Figure 25B:
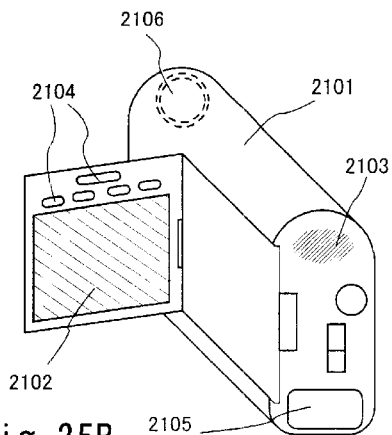

FIG. 25(B) is a video camera, which is constructed with a main body 2101, a display device 2102, a voice input device 2103, an operating switch 2104, a battery 2105 and an image receiving device 2106. A TFT fabricated using a crystalline semiconductor film fabricated by laser annealing according to the invention may be applied to the display device 2102 or the other signal control circuits.

Figure 25C:
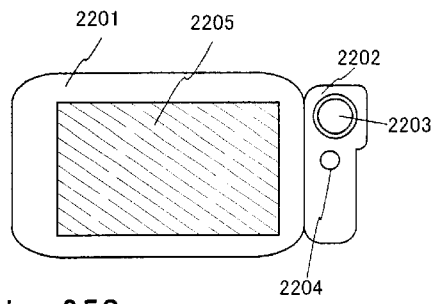

FIG. 25(C) is a portable data terminal, which is constructed with a main body 2201, an image input device 2202, an image receiving device 2203, an operating switch 2204 and a display device 2205. A TFT fabricated using a crystalline semiconductor film fabricated by laser annealing according to the invention may be applied to the display device 2205 or the other signal control circuits.

Figure 25D:
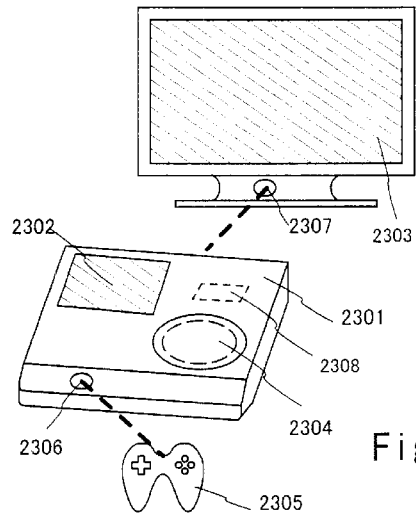

FIG. 25(D) is an electronic game device for TV games or video games, and it is constructed with a body 2301 housing an electronic circuit 2308 such as a CPU and a recording medium 2304, a controller 2305, a display device 2303, and a display device 2302 incorporated into the body 2301. The display device 2303 and the display device 2302 incorporated into the body 2301 may display the same information, or the former may serve as the main display device and the latter as the secondary device, for display of information on the recording medium 2304, display of the operating state of the device, or as an operating board if provided with a touch sensor function. The body 2301, controller 2305 and display device 2303 may have a wire linkup for transmission of signals between them, or sensors 2306, 2307 may be provided for wireless transmission or optical transmission. A TFT fabricated using a crystalline semiconductor film fabricated by laser annealing according to the invention may be used in the display devices 2302, 2303. The display device 2303 used may be a conventional CRT.

Figure 25E:
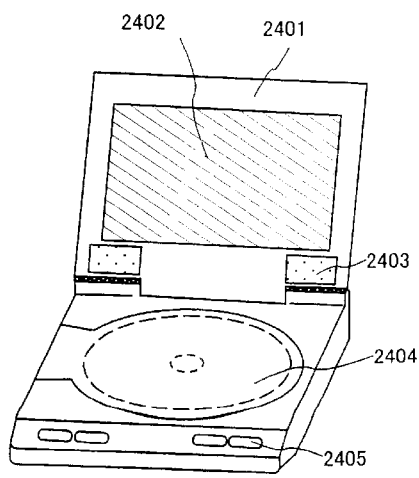

FIG. 25(E) is a player used for program-recorded recording media (hereunder referred to simply as recording media), and it is constructed with a main body 2401, a display device 2402, a speaker 2403, a recording medium 2404 and an operating switch 2405. The recording medium used may be a DVD (Digital Versatile Disc) or compact disc (CD), and this allows music program reproduction and image display, as well as display of data for video games (or TV games) and through the internet. A TFT fabricated using a crystalline semiconductor film fabricated by laser annealing according to the invention may be advantageously used for the display device 2402 or other signal control circuits.

Figure 25F:
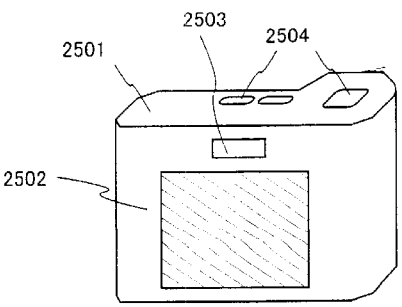

FIG. 25(F) is a digital camera, which is constructed with a main body 2501, a display device 2502, an eyepiece 2503, an operating switch 2504 and an image receiver (not shown). A TFT fabricated using a crystalline semiconductor film fabricated by laser annealing according to the invention may be applied to the display device 2502 or other signal control circuits.

Figure 26A:
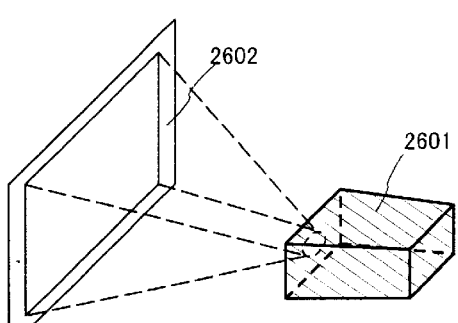
FIGS. 26A–D are illustrations of the structure of a projection liquid crystal display device.
Figure 26B:
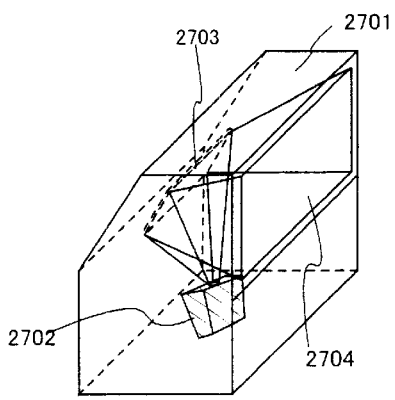

FIG. 26(A) a front projector, which is constructed with a light source optical system and display device 2601 and a screen 2602. The present invention may be applied to the display device or to the other signal control circuits. FIG. 26(B) is a rear projector, which is constructed with a body 2701, a light source optical system and display device 2702, a mirror 2703 and a screen 2704. A TFT fabricated using a crystalline semiconductor film fabricated by laser annealing according to the invention may be applied to the display device or other signal control circuits.

Figure 26C:
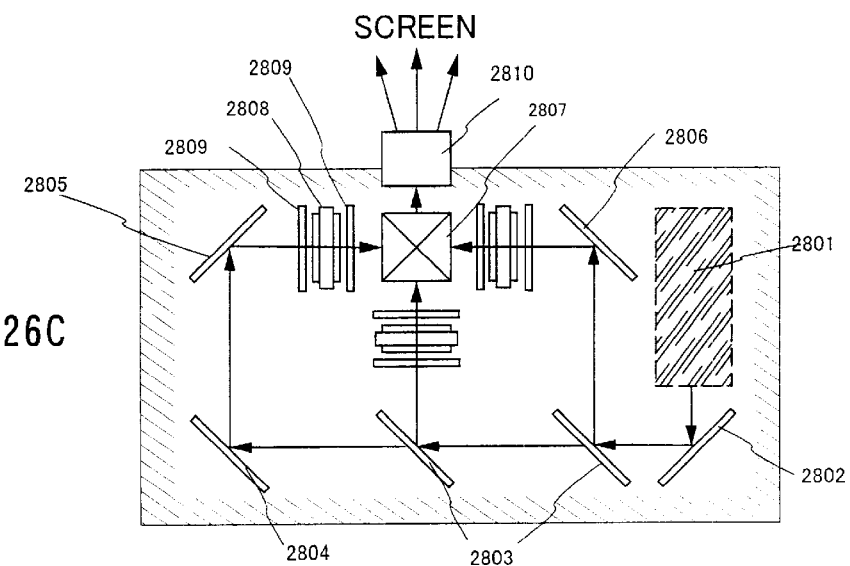
Figure 26D:
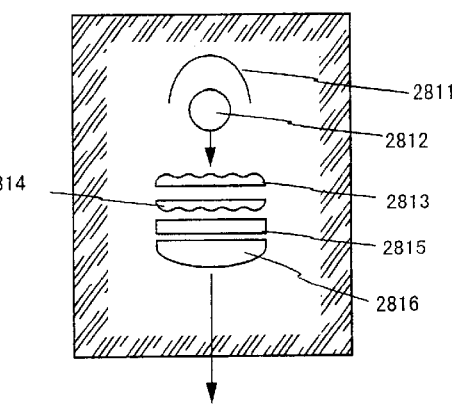

FIG. 26(C) shows an example of the construction of a light source optical system and display device 2601, 2702 for FIG. 26(A) and FIG. 26(B). The light source optical system and display device 2601, 2702 is constructed with a light source optical system 2801, mirrors 2802, 2804–2806, dichroic mirror 2803, beam splitter 2807, liquid crystal display device 2808, phase contrast panel 2809 and projection optical system 2810. The projection optical system 2810 is constructed with multiple optical lenses. FIG. 26(C) shows a three-panel type using three liquid crystal display devices 2808, but there is no limit to this type of system, and the construction may employ a single-panel type optical system instead. The light path indicated by the arrow in FIG. 26(C) may also be provided with an appropriate optical lens, or film with a polarizing function, film for phase adjustment, IR film or the like. FIG. 26(D) shows an example of a structure for the light source optical system 2801 of FIG. 26(C). In this example, the light source optical system 2801 is constructed with a reflector 2811, light source 2812, lens array 2813, 2814, polarization altering element 2815 and converging lens 2816. The light source optical system shown in FIG. 26(D) is only one instance and there is no limitation to the construction shown.

While not shown here, the present invention may also be applied to navigation systems and to reading circuits of image sensors. Thus, the scope of the present invention is very wide and it can be applied to electronic instruments in a variety of fields. The electronic instruments for these examples can also be realized using constructions with any combination of Examples 1 to 7, employing the crystallization techniques according to Embodiments 1 to 3.

By using the crystallization technique of the present invention it is possible to fabricate a crystalline semiconductor film with controlled locations and sizes of the crystal grains. By thus forming the crystal grains of the crystalline semiconductor film to match the TFT channel-forming regions, it is possible to form at least the channel-forming regions with single crystal grains, and to obtain characteristics substantially comparable to a TFT fabricated with single crystal semiconductor films.

Also, by forming the thermal conductive layer with a translucent insulating material, it is possible to eliminate the parasitic volume of the back channel in a top-gate TFT, while application to various semiconductor devices such as EL display devices and image sensors, including transmission liquid crystal display devices, will allow designs that can give these semiconductor devices greater functionality.

What is claimed is:

1. A semiconductor device comprising:
    a translucent thermal conductive layer formed on an insulating substrate, said translucent thermal conductive film having a thermal conductivity of 10 $Wm^{-1}K^{-1}$ or greater,
    a first insulating layer formed at a selected portion on said thermal conductive layer, said first insulating layer having the thermal conductivity of less than 10 $Wm^{-1}K^{-1}$, and
    a semiconductor film formed on said first insulating layer selectively, said semiconductor film comprising single crystal grains added hydrogen.

2. A semiconductor device according to claim 1 wherein a second insulating layer is formed on said thermal conductive layer and said first insulating layer, and said semiconductor film is in contact with said second insulating layer.

3. A semiconductor device according to claim 1 wherein said thermal conductive layer contains at least one element selected from the group consisting of aluminum oxide, aluminum nitride, aluminum oxynitride, silicon nitride and boron nitride.

4. A semiconductor device according to claim 1 wherein said thermal conductive layer contains at least one element selected from the group consisting of Si, N, O, Al, and rare earth elements.

5. A semiconductor device according to claim 1 wherein said first insulating layer is a silicon oxynitride film comprising oxygen at a concentration from 55 atomic % to 70 atomic % and nitrogen at the concentration from 1 atomic % to 20 atomic %.

6. A semiconductor device according to claim 2 wherein said second insulating layer is a silicon oxynitride film comprising oxygen at a concentration from 55 atomic % to 70 atomic % and nitrogen at the concentration from 1 atomic % to 20 atomic %.

7. A semiconductor device according to claim 1 wherein each angle at side edges of said first insulating layer with the surface of said insulating substrate is between 10° and 40°.

8. A semiconductor device according to claim 1 wherein said semiconductor device is a display device employing an electroluminescence material.

9. A semiconductor device according to claim 1 wherein said semiconductor device is selected from the group consisting of a personal computer, a video camera, a portable data terminal, a digital camera, a digital video disk player, an electronic game equipment and a projector.

10. A semiconductor device comprising:
    a translucent thermal conductive layer formed on an insulating substrate, said translucent thermal conductive film having a thermal conductivity of 10 $Wm^{-1}K^{-1}$ or greater,
    a first insulating layer insularly formed at a selected portion on said thermal conductive layer, said first insulating layer having the thermal conductivity of less than 10 $Wm^{-1}K^{-1}$, and
    a semiconductor film formed on said first insulating layer selectively, said semiconductor film comprising single crystal grains added hydrogen.

11. A semiconductor device according to claim 10 wherein a second insulating layer is formed on said thermal conductive layer and said first insulating layer, and said semiconductor film is in contact with said second insulating layer.

12. A semiconductor device according to claim 10 wherein said thermal conductive layer contains at least one element selected from the group consisting of aluminum oxide, aluminum nitride, aluminum oxynitride, silicon nitride and boron nitride.

13. A semiconductor device according to claim 10 wherein said thermal conductive layer contains at least one element selected from the group consisting of Si, N, O, Al, and rare earth elements.

14. A semiconductor device according to claim 10 wherein said first insulating layer is a silicon oxynitride film comprising oxygen at a concentration from 55 atomic % to 70 atomic % and nitrogen at the concentration from 1 atomic % to 20 atomic %.

15. A semiconductor device according to claim 11 wherein said second insulating layer is a silicon oxynitride film comprising oxygen at a concentration from 55 atomic % to 70 atomic % and nitrogen at the concentration from 1 atomic % to 20 atomic %.

16. A semiconductor device according to claim 10 wherein each angle at side edges of said first insulating layer with the surface of said substrate is between 10° and 40°.

17. A semiconductor device according to claim 10 wherein said semiconductor device is a display device employing an electroluminescence material.

18. A semiconductor device according to claim 10 wherein said semiconductor device is selected from the group consisting of a personal computer, a video camera, a portable data terminal, a digital camera, a digital video disk player, an electronic game equipment and a projector.

19. A semiconductor device having at least one TFT provided over a substrate, said semiconductor device comprising:
    a translucent thermal conductive layer formed over a surface of said substrate, said translucent thermal conductive film having a thermal conductivity of 10 $Wm^{-1}K^{-1}$ or greater,
    a first insulating layer formed at a selected portion on said thermal conductive layer, said first insulating layer having the thermal conductivity of less than 10 $Wm^{-1}K^{-1}$, and
    a semiconductor film formed on said first insulating layer selectively, said semiconductor film comprising single crystal grains added hydrogen,
    wherein side edges of said first insulating layer are tapered,
    wherein a channel-forming region of said TFT is formed in said semiconductor film.

20. A semiconductor device according to claim 19 wherein a second insulating layer is formed on said thermal conductive layer and said first insulating layer, and said semiconductor film is in contact with said second insulating layer.

21. A semiconductor device according to claim 19 wherein said thermal conductive layer contains at least one element selected from the group consisting of aluminum oxide, aluminum nitride, aluminum oxynitride, silicon nitride and boron nitride.

22. A semiconductor device according to claim 19 wherein said thermal conductive layer contains at least one element selected from the group consisting of Si, N, O, Al, and rare earth elements.

23. A semiconductor device according to claim 19 wherein said first insulating layer is a silicon oxynitride film comprising oxygen at a concentration from 55 atomic % to 70 atomic % and nitrogen at the concentration from 1 atomic % to 20 atomic %.

24. A semiconductor device according to claim 20 wherein said second insulating layer is a silicon oxynitride film comprising oxygen at a concentration from 55 atomic % to 70 atomic % and nitrogen at the concentration from 1 atomic % to 20 atomic %.

25. A semiconductor device according to claim 19 wherein each angle at the tapered side edges of said first insulating layer with the surface of said substrate is between 10° and 40°.

26. A semiconductor device according to claim 19 wherein said semiconductor device is a display device employing an electroluminescence material.

27. A semiconductor device according to claim 19 wherein said semiconductor device is selected from the group consisting of a personal computer, a video camera, a portable data terminal, a digital camera, a digital video disk player, an electronic game equipment and a projector.

28. A semiconductor device having at least one TFT provided over a substrate, said semiconductor device comprising:
- a translucent thermal conductive layer formed over a surface of a substrate, said translucent thermal conductive film having a thermal conductivity of 10 $Wm^{-1}K^{-1}$ or greater,
- a first insulating layer insularly formed at a selected portion on said thermal conductive layer, said first insulating layer having the thermal conductivity of less than 10 $Wm^{-1}K^{-1}$, and
- a semiconductor film formed on said first insulating layer selectively, said semiconductor film comprising single crystal grains added hydrogen,
- wherein side edges of said first insulating layer are tapered,
- wherein a channel-forming region of said TFT is formed in said semiconductor film.

29. A semiconductor device according to claim 28 wherein a second insulating layer is formed on said thermal conductive layer and said first insulating layer, and said semiconductor film is in contact with said second insulating layer.

30. A semiconductor device according to claim 28 wherein said thermal conductive layer contains at least one element selected from the group consisting of aluminum oxide, aluminum nitride, aluminum oxynitride, silicon nitride and boron nitride.

31. A semiconductor device according to claim 28 wherein said thermal conductive layer contains at least one element selected from the group consisting of Si, N, O, Al, and rare earth elements.

32. A semiconductor device according to claim 28 wherein said first insulating layer is a silicon oxynitride film comprising oxygen at a concentration from 55 atomic % to 70 atomic % and nitrogen at the concentration from 1 atomic % to 20 atomic %.

33. A semiconductor device according to claim 29 wherein said second insulating layer is a silicon oxynitride film comprising oxygen at a concentration from 55 atomic % to 70 atomic % and nitrogen at the concentration from 1 atomic % to 20 atomic %.

34. A semiconductor device according to claim 28 wherein each angle at the tapered side edges of said first insulating layer with the surface of said substrate is between 10° and 40°.

35. A semiconductor device according to claim 28 wherein said semiconductor device is a display device employing an electroluminescence material.

36. A semiconductor device according to claim 28 wherein said semiconductor device is selected from the group consisting of a personal computer, a video camera, a portable data terminal, a digital camera, a digital video disk player, an electronic game equipment and a projector.

37. A semiconductor device comprising:
- a translucent thermal conductive layer formed over a substrate;
- a first insulating layer formed at a selected portion on said thermal conductive layer, and
- a semiconductor film formed on said first insulating layer selectively,
- wherein side edges of said first insulating layer are tapered,
- wherein a thermal conductivity of said translucent thermal conductive layer is larger than that of said first insulating layer.

38. A semiconductor device according to claim 37 wherein a second insulating layer is formed on said thermal conductive layer and said first insulating layer, and said semiconductor film is in contact with said second insulating layer.

39. A semiconductor device according to claim 37 wherein said thermal conductive layer contains at least one element selected from the group consisting of aluminum oxide, aluminum nitride, aluminum oxynitride, silicon nitride and boron nitride.

40. A semiconductor device according to claim 37 wherein said thermal conductive layer contains at least one element selected from the group consisting of Si, N, O, Al, and rare earth elements.

41. A semiconductor device according to claim 37 wherein said first insulating layer is a silicon oxynitride film comprising oxygen at a concentration from 55 atomic % to 70 atomic % and nitrogen at the concentration from 1 atomic % to 20 atomic %.

42. A semiconductor device according to claim 38 wherein said second insulating layer is a silicon oxynitride film comprising oxygen at a concentration from 55 atomic % to 70 atomic % and nitrogen at the concentration from 1 atomic % to 20 atomic %.

43. A semiconductor device according to claim 37 wherein each angle at the tapered side edges of said first insulating layer with the surface of said substrate is between 10° and 40°.

44. A semiconductor device according to claim 37 wherein said semiconductor device is a display device employing an electroluminescence material.

45. A semiconductor device according to claim 37 wherein said semiconductor device is s elected from the group consisting of a personal computer, a video camera, a portable data terminal, a digital camera, a digital video disk player, an electronic game equipment and a projector.

* * * * *